(12) United States Patent
Ohmi et al.

(10) Patent No.: US 7,193,434 B2
(45) Date of Patent: Mar. 20, 2007

(54) SEMICONDUCTOR INTEGRATED CIRCUIT

(75) Inventors: Tadahiro Ohmi, Miyagi (JP); Koji Kotani, Miyagi (JP); Kazuyuki Maruo, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/182,018

(22) Filed: Jul. 15, 2005

(65) Prior Publication Data

US 2006/0017071 A1 Jan. 26, 2006

(30) Foreign Application Priority Data

Jul. 16, 2004 (JP) .............................. 2004-210698

(51) Int. Cl.
*H03K 19/173* (2006.01)
(52) U.S. Cl. .......................................... 326/38; 326/41
(58) Field of Classification Search ................ 326/26, 326/27, 82, 83, 87, 37–41
See application file for complete search history.

(56) References Cited

U.S. PATENT DOCUMENTS 5,811,991 A * 9/1998 Takashima .................. 326/97
6,163,169 A * 12/2000 Lawson ...................... 326/58
6,735,755 B2 * 5/2004 Shau ........................... 716/16
2003/0212853 A1 * 11/2003 Huppenthal et al. ........ 711/104

FOREIGN PATENT DOCUMENTS

JP             553689           1/1980

* cited by examiner

*Primary Examiner*—Don Le
(74) *Attorney, Agent, or Firm*—Smith Gambrell & Russell, PLLC

(57) ABSTRACT

There is provided a high-performance semiconductor integrated circuit whose circuit area is small and whose wiring length is short. The semiconductor integrated circuit is constructed in a multi-layer structure and is provided with a switch block for switching connections among a plurality of signal lines by means of a plurality of transistors formed respectively in a plurality of semiconductor layers and a plurality of logic blocks formed in each of the plurality of semiconductor layers and connected to each of the plurality of signal lines. The first switch block is a programmable switch block capable of changing the connection topology among the plurality of signal lines.

14 Claims, 24 Drawing Sheets

SEMICONDUCTOR INTEGRATED CIRCUIT

The present application claims priority from a Japanese Patent application No. 2004-210698 filed on Jul. 16, 2004, the contents of which are incorporated herein by reference.

BACKGROUND OF THE INVENTION

1. Field of the Invention

The present invention relates to a semiconductor integrated circuit and, more specifically, to a programmable semiconductor integrated circuit configured in a multi-layer structure.

2. Description of Related Art

FIG. 1 shows a configuration of a conventional programmable semiconductor integrated circuit 10 as disclosed in Japanese Patent Laid-Open No. 1994-53689, for example. The semiconductor integrated circuit 10 is provided with CLBs (Configurable Logic Block) 14 containing programmable logic circuits combined with programmable delay circuits such as a flip-flop circuit and PSMs (Programmable Switch Matrix) 12.

FIG. 2 shows a configuration of the PSM 12. The PSM 12 has a plurality of programmable switches 16. Each of the programmable switches 16 switches four wires each other. FIG. 3 shows a configuration of the programmable switch 16. The programmable switch 16 is provided with six switches 18, 20, 22, 24, 26 and 28 for the four wires for example and mutually switches connections among the four signal lines. The semiconductor integrated circuit 10 realizes desirable circuit functions through logical operations of the CLBs 14 and switching operations of the PSMs specified by control signals from the outside.

FIG. 4 is a graph representing the semiconductor integrated circuit 10 having a mesh-type wiring structure. In the semiconductor integrated circuit 10 having the mesh-type wiring structure, a plurality of nodes 30 are connected by wires 32 in mesh. The nodes 30 are the CLBs 14 for example. It is noted that Levels 1, 2, 3 and so on are defined corresponding to the hierarchy of the nodes 30.

Terms are defined as follows, A 'number of wires' is a number of wires necessary for constructing a certain type of a graph. For instance, the number of wires in the graph in FIG. 4 is 12. A 'path' has a minimum number of interconnected wires necessary for communicating between two nodes. A 'longest path' has a route between two nodes wherein the interconnected wires is the longest. 'Adjacency' refers to a relationship between two nodes wherein the path is 1. A 'number of branches' refers to a number of nodes being able to adjacent to a certain node.

FIGS. 5 and 6 are graphed representations of a semiconductor integrated circuit having a tree-type wiring structure. In the semiconductor integrated circuit having the tree-type wiring structure, a plurality of nodes 34 are connected in a shape of a tree by wires 36. The node 34a may be the PSM for example and the node 34b may be the CLB for example. It is noted that Level 1, 2, 3 and so on are defined corresponding to the hierarchy of the nodes 34 as shown in FIGS. 5 or 6.

In Level 1, there is only one node which is called a root node. A parent-child relationship also exists among the nodes 34 in the semiconductor integrated circuit having the P-branch tree-type wiring structure. That is, the nodes on Level (L) are adjacent to the parent node, which is the node on Level (L−1), and to the P-child nodes, which are the nodes on Level (L+1).

FIG. 7 is a graph showing the relationship between the number of nodes N and the number of wires of the mesh-type and tree-type wiring structures. The number of nodes on Level (L) is $L^2$ in case of the mesh-type and $P^{L-1}$ in case of the P-branch tree-type wiring structure. The number of wires on Level (L) is 2L(L−1) in case of the mesh-type and is $P^{L-1}$ in case of the P-branch tree-type wiring structure. Accordingly, although the number of wires of the mesh-type wiring structure is almost equal to that of the binary tree-type wiring structure provided that the number of nodes are equal. The more the number of branches increases from the parent node like a quarter tree-type and octal tree-type wiring structures, the less the number of wires becomes as shown in FIG. 7.

FIG. 8 is a graph showing the relationship between the number of nodes N and the longest path in the mesh-type and tree-type wiring structures. The number of nodes on Level (L) is $L^2$ in case of the mesh-type wiring structure and is $P^{L-1}$ in case of the P-branch tree-type wiring structure. Still more, the longest path on Level (L) is 2(L−1) in case of the mesh-type wiring structure and 2(L−1) in case of the P-branch tree-type wiring structure. Accordingly, when the number of nodes N becomes 40 is more, the longest path of any one of the binary tree-type, quarter tree-type and octal tree-type wiring structures becomes smaller than that of the mesh-type wiring structure as shown in FIG. 8.

As described above, the tree-type wiring structure is advantageous over the mesh-type wiring structure from the both aspects of the number of wires and the longest path. Still more, the larger the number of branches of the tree-type wiring structure, the more advantageous over the mesh-type wiring structure becomes.

FIG. 9 is a schematic plan view of the PSM having eight input/outputs. The eight-input/outputs PSM is provided with 28 MOSFETs as switches to eight signal lines and mutually switches connections among the eight signal lines. Therefore, because the MOSFETs are integrated in a plane of a single semiconductor layer in the conventional semiconductor integrated circuit, there has been a problem that a circuit area becomes very large in implementing a complicated circuit by using a large number of MOSFETs. Accordingly, although the tree-type wiring structure is advantageous over the mesh-type wiring structure and is more advantageous if the number of branches is large as described above, it has been difficult to realize it from the aspect that the circuit area becomes very large.

Accordingly, it is an object of the invention to provide a semiconductor integrated circuit which is capable of solving the above-mentioned problem. This object may be achieved through the combination of features described in independent claims of the invention. Dependent claims thereof specify preferable embodiments of the invention.

SUMMARY OF INVENTION

According to the first aspect of the invention, a semiconductor integrated circuit configured in a multi-layer structure is provided with a first switch block for switching connections among a plurality of signal lines by means of a plurality of transistors formed respectively in a plurality of semiconductor layers and a plurality of first logic blocks formed in each of the plurality of semiconductor layers and connected to each of the plurality of signal lines.

Preferably, the first switch block is a programmable switch block capable of changing the connection topology among the plurality of signal lines.

More preferably, the first logic block is a programmable logic block capable of changing functions of a logic circuit.

Preferably, the first switch block has a plurality of first semiconductor layer transistors formed in the first semiconductor layer and a plurality of second semiconductor layer transistors formed in the second semiconductor layer, a plurality of first semiconductor layer logic blocks in the plurality of first logic blocks is formed in the first semiconductor layer, a plurality of second semiconductor layer logic blocks in the plurality of first logic blocks is formed in the second semiconductor layer, the plurality of first semiconductor layer logic blocks is mutually connected by means of any one of the plurality of first semiconductor layer transistors and the plurality of second semiconductor layer logic blocks is mutually connected by means of any one of the plurality of second semiconductor layer transistors.

Insulation of a gate insulating film of the first semiconductor layer transistor may be almost equal to insulation of a gate insulating film of the second semiconductor layer transistor.

The first semiconductor layer logic block may be connected mutually with the second semiconductor layer logic block through the first semiconductor layer transistor.

The first and second semiconductor layer logic blocks inputting/outputting digital signals may be mutually connected through any one of the plurality of first semiconductor layer transistors and the first and second semiconductor layer logic blocks inputting/outputting analog signals may be mutually connected through any one of the plurality of second semiconductor layer transistors.

The plurality of first semiconductor layer logic blocks and the plurality of second semiconductor layer logic blocks may be formed on the identical location in the first semiconductor layer or in the second semiconductor layer.

Preferably, each of the plurality of first logic blocks has a second switch block for switching connections among the plurality of signal lines by a means of plurality of transistors that is formed respectively in a plurality of semiconductor layers and a plurality of second logic blocks formed in each of the plurality of semiconductor layers and connected to each of the plurality of signal lines.

Preferably, the second switch block of one of the first logic blocks has a first semiconductor layer transistor formed in a first semiconductor layer among the plurality of semiconductor layers and a second semiconductor layer transistor formed in a second semiconductor layer which is the upper layer of the first semiconductor layer among the plurality of semiconductor layers;

a first semiconductor layer logic block in the plurality of second logic blocks of the one of first logic blocks is formed in the first semiconductor layer;

a second semiconductor layer logic block in the plurality of second logic blocks of the one of first logic blocks is formed in the second semiconductor layer;

the first semiconductor layer transistor or the second semiconductor layer transistor switches connection between signal lines connected to the first and second semiconductor layer logic blocks;

the second switch block of another first logic block has a third semiconductor layer transistor formed in a third semiconductor layer which is the upper layer of the second semiconductor layer among the plurality of semiconductor layers and a fourth semiconductor layer transistor formed in a fourth semiconductor layer which is the upper layer of the third semiconductor layer among the plurality of semiconductor layers;

a third semiconductor layer logic block in the plurality of second logic blocks of the other first logic block is formed in the third semiconductor layer;

a fourth semiconductor layer logic block in the plurality of second logic blocks of the other first logic block is formed in the fourth semiconductor layer;

the third semiconductor layer transistor or the fourth semiconductor layer transistor switches connection between the signal lines connected to the third semiconductor layer logic block and the fourth semiconductor layer logic block;

the first switch block has first and second host transistors formed respectively in any one of the first, second, third and fourth semiconductor layers; and the first host transistor or the second host transistor switches connection between the signal lines connected to one of the second switch block and to the other second switch block.

Thus, the invention can provide the high-performance semiconductor integrated circuit whose circuit area is small and whose wiring length is short.

It is noted that the summary of the invention does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention, All of the features and the combinations thereof described in the embodiments are not necessarily essential to the invention.

Figure 10:
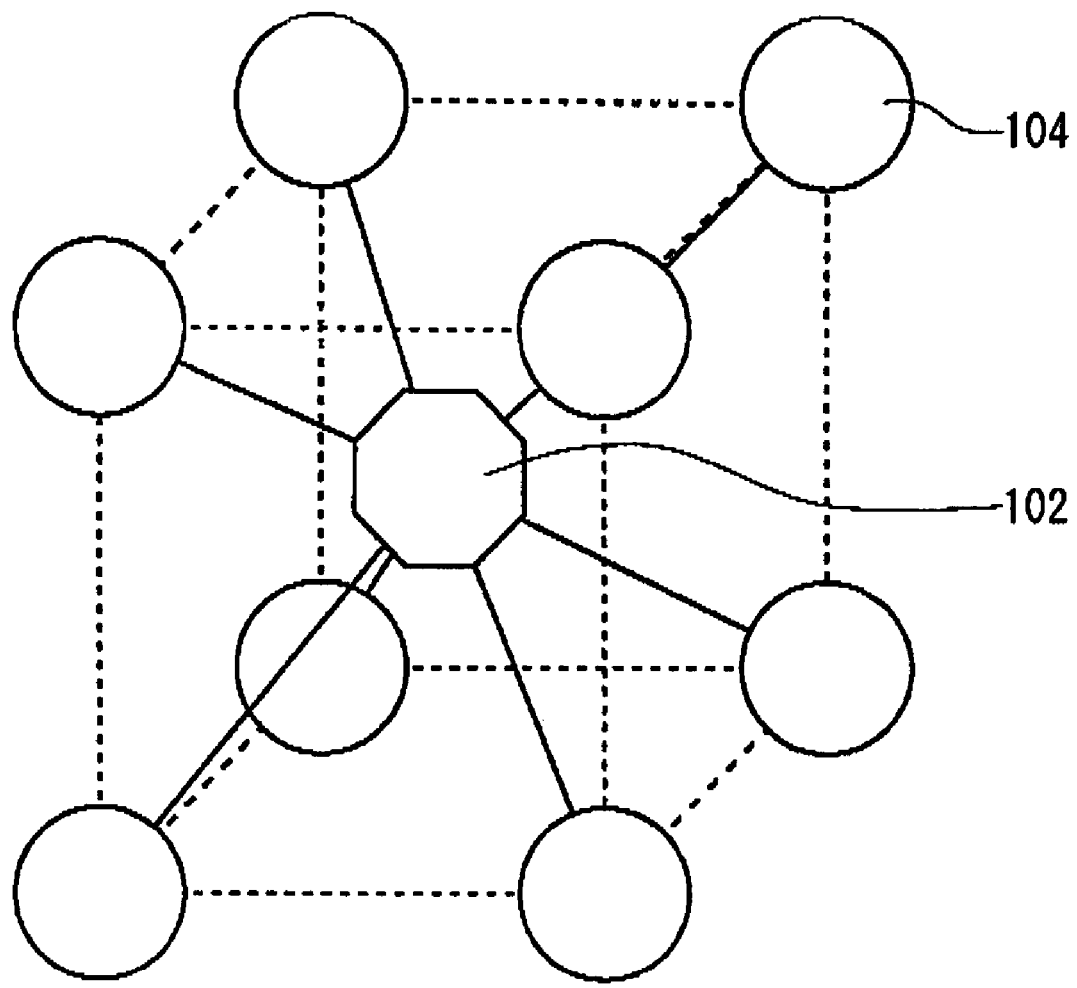
FIG. 10 is a graphed representation of one example of a semiconductor integrated circuit.

FIG. 10 is a graphed representation of one example of a semiconductor integrated circuit 100 according to a first embodiment of the invention. The semiconductor integrated circuit 100 is provided with a PSM 102 and a plurality of CLBs 104. In this example, the PSM 102 has eight input/outputs, which are connected with the eight CLBs 104, That is, the semiconductor integrated circuit 100 has an octal tree-type wiring structure on Level 2. The PSM 102 is one example of a switch block of the invention and is a programmable switch block that is capable of changing the connection topology among the plurality of signal lines based on a setting from the outside. The CLB 104 is one example of a logical block of the invention and is a programmable logical block that is capable of changing functions of a logical circuit based on a setting from the outside.

The PSM 102 switches connections among the plurality of signal lines connected respectively to the plurality of CLBs 104 by means of a plurality of MOSFETs formed respectively in a plurality of semiconductor layers. The plurality of CLBs 104 are formed respectively in the plurality of semiconductor layers and are connected respectively to the plurality of signal lines connected to the PSM 102.

The programmable semiconductor integrated circuit 100 having the tree-type wiring structure may be implemented in a small circuit area by constructing the PSM 102 and the CLBs 104 in the multi-layer structure as described above.

Figure 11:
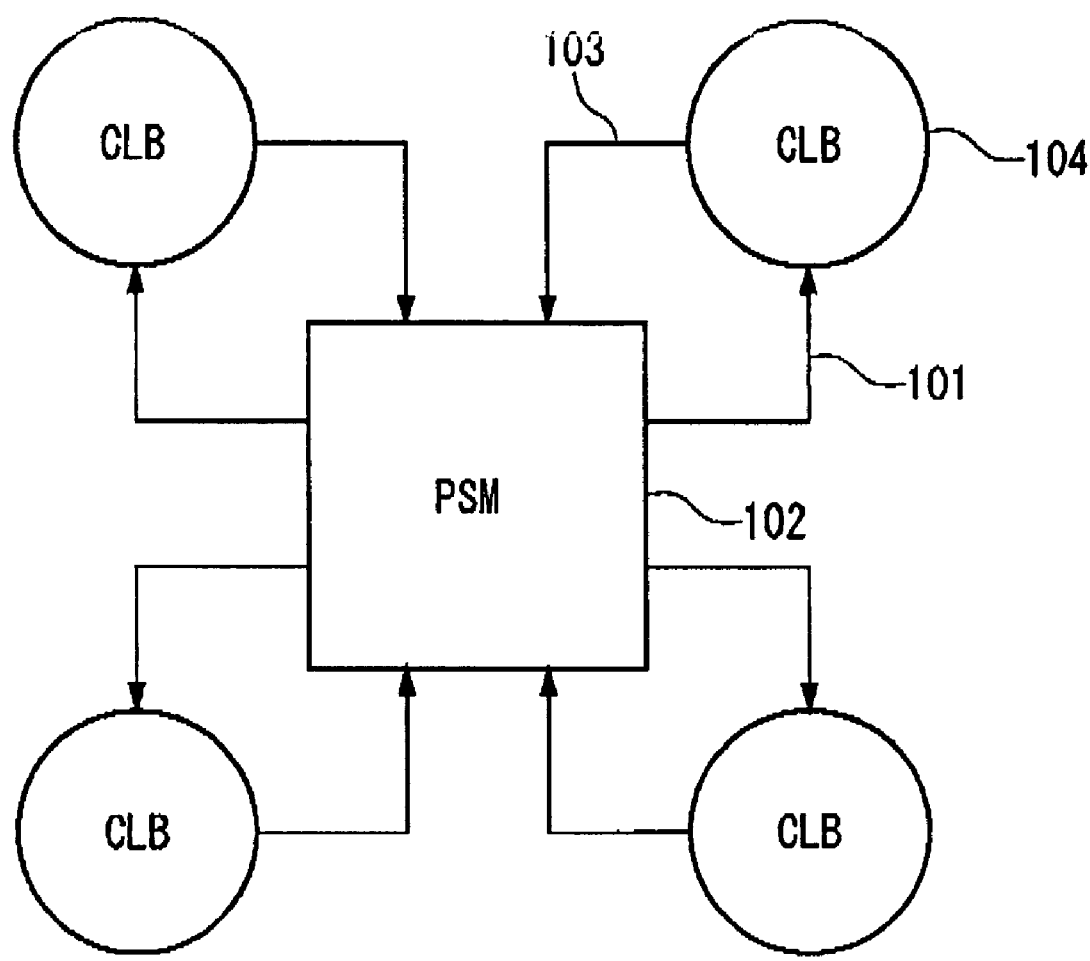
FIG. 11 is a diagram showing one example of configurations of the semiconductor integrated circuit.

FIG. 11 is a diagram showing one exemplary configuration of the semiconductor integrated circuit 100 of the first embodiment. The semiconductor integrated circuit 100 is provided with the PSM 102, the CLBs 104, a plurality of input signal lines 101 for inputting a signal from the PSM 102 to each of the plurality of CLBs 104 and a plurality of output signal lines 103 for outputting a signal from each of the plurality of CLBs 104 to the PSM 102. The PSM 102 is constructed in the multi-layer structure and realizes predetermined functions or programmable functions of the semiconductor integrated circuit 100 by mutually switching connections among the plurality of input signal lines 101 and the plurality of output signal lines 103 by means of the MOSFETs provided in each layer.

Figure 12:
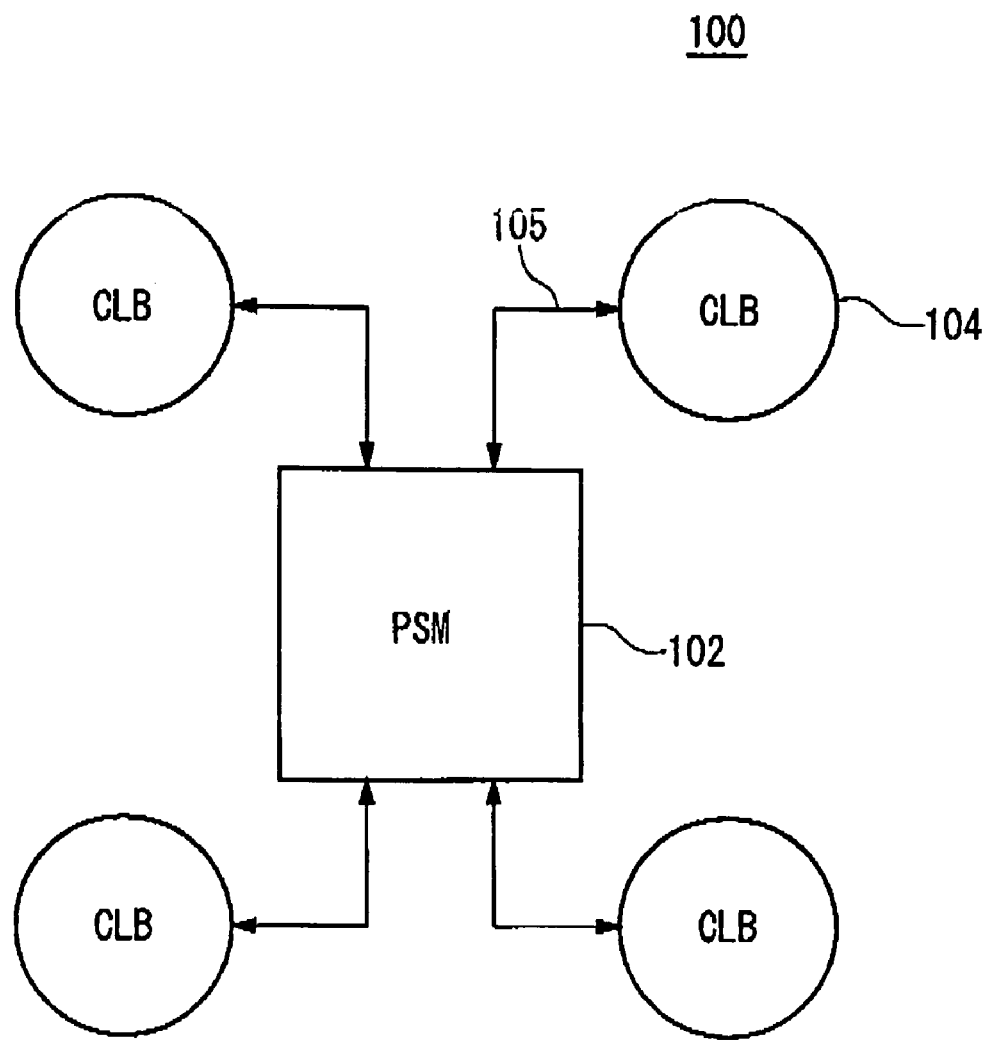
FIG. 12 is a diagram showing another example of the configuration of the semiconductor integrated circuit.

FIG. 12 is a diagram showing another exemplary configuration of the semiconductor integrated circuit 100 of the first embodiment. The semiconductor integrated circuit 100 is provided with the PSM 102, the CLBs 104 and a plurality of input/output signal lines 105 for transmitting signals between the PSM 102 and the CLBs 104. The PSM 102 is constructed in the multi-layer structure and realizes the predetermined functions or the programmable function of the semiconductor integrated circuit 100 by mutually switching connections among the plurality of input/output signal lines 105 by means of the MOSFETs provided in each layer. That is, one signal line may function as the input and output signal lines. Thereby, the wiring amount of the semiconductor integrated circuit 100 may be reduced.

Figure 13:
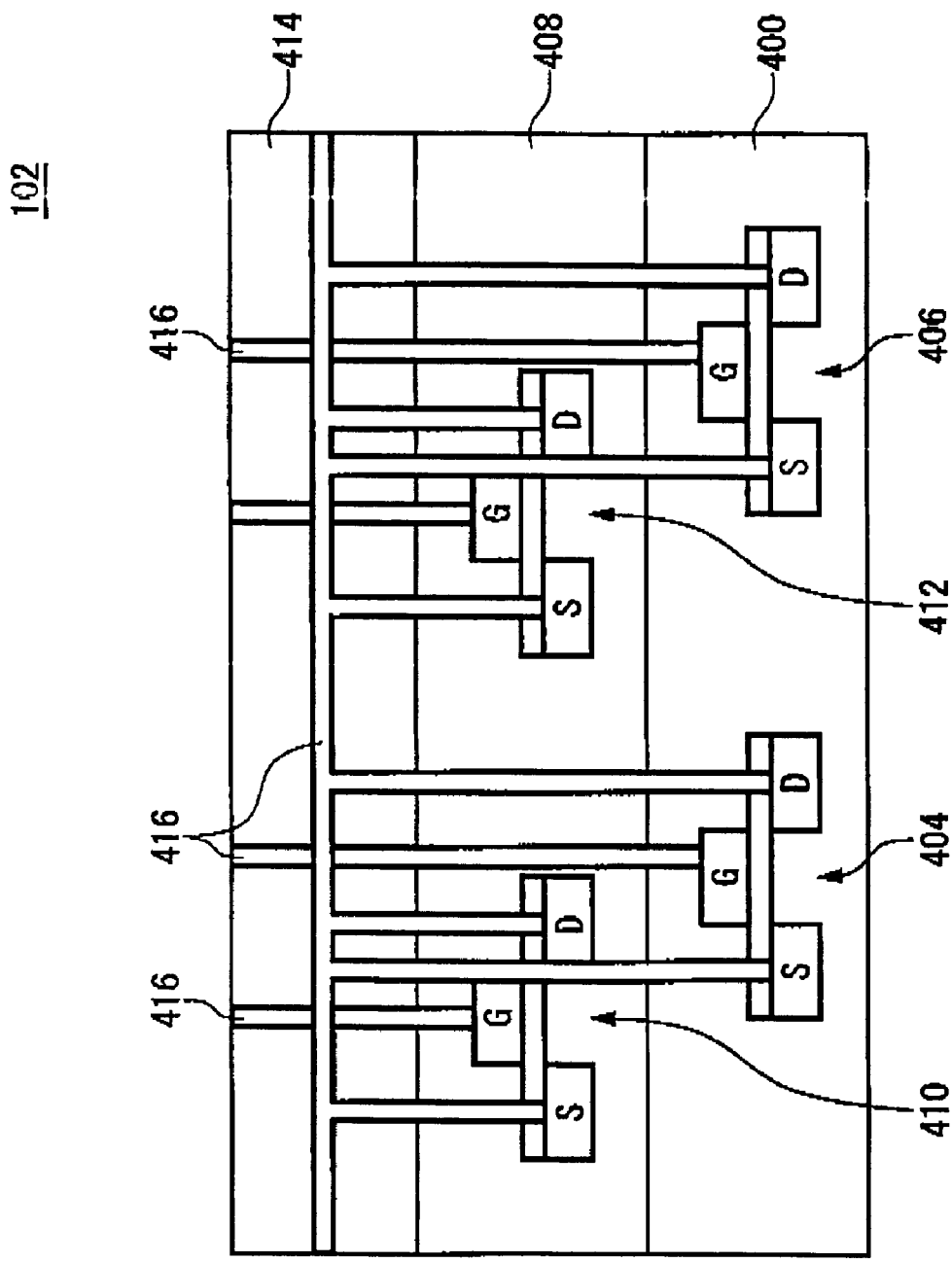
FIG. 13 is a schematic section view of one exemplary configuration of a PSM.

FIG. 13 is a schematic section view of one exemplary configuration of the PSM 102 of the first embodiment. The PSM 102 is provided with a first semiconductor layer 400 formed out of monocrystalline silicon, a plurality of MOSFETs 404 and 406 formed in the first semiconductor layer 400, a second semiconductor layer 408, i.e., an upper layer of the first semiconductor layer 400, formed out of polycrystalline silicon, a plurality of MOSFETs 410 and 412 formed in the second semiconductor layer 408 and a wiring layer 414 which is the upper layer of the second semiconductor layer 408. The MOSFETs 404 and 406 are one example of a first semiconductor layer transistor of the invention and the MOSFETs 410 and 412 are one example of a second semiconductor layer transistor of the invention.

Source electrodes, drain electrodes and gate electrodes of the MOSFETs 404 and 406 formed in the first semiconductor layer 400 and those of the MOSFETs 410 and 412 formed in the second semiconductor layer 408 are connected to each other or to the outside such as the CLBs 104 via wires 416 formed in the wiring layer 414. The wires 416 connected to the MOSFETs 404 and 406 formed in the first semiconductor layer 400 are connected to the wiring layer 414 through via-holes formed through the second semiconductor layer 408. Preferably, at least a part of the MOSFET 404 or 406 overlaps with the MOSFETs 410 and 412 in the direction from the first semiconductor layer 400 to the second semiconductor layer 408. It allows the circuit area of the PSM 102 to be reduced.

Next, a manufacturing method of the PSM 102 will be explained. The first semiconductor layer 400 is formed at first and then the MOSFETs 404 and 406 are formed in the first semiconductor layer 400. In forming the MOSFETs 404 and 406 in the first semiconductor layer 400, a gate insulating film is formed by means of thermal oxidation in the first semiconductor layer 400 to form a first gate electrode. Next, the second semiconductor layer 408 is deposited on the first semiconductor layer 400 and the MOSFETs 410 and 412 are formed in the second semiconductor layer 408. In forming the MOSFETs 410 and 412 in the second semiconductor layer 408, a gate insulating film is formed by means of radical oxidation or radical nitridation in the second semiconductor layer 408 to form a gate electrode. Next, the wiring layer 414 containing the wires 416 is formed.

Insulation of the gate insulating film of the MOSFETs 404 and 406 is almost equal to that of the gate insulating film of the MOSFETs 410 and 412 even if the gate insulating film of the first semiconductor layer 400 is formed by means of the thermal oxidation and the gate insulating film of the second semiconductor layer 408 is formed by means of the radial oxidation or the radial nitridation. It is noted that the performance of the gate insulating film formed by means of the radical oxidation or the radical nitridation as compared to the gate insulating film formed by means of the thermal oxidation will be explained in conjunction with FIGS. 21 through 24.

The high-performance PSM 102 may be fabricated by forming the gate insulating film of the first semiconductor layer 400 by means of the thermal oxidation and the gate insulating film of the second semiconductor layer 408 by means of the radical oxidation or the radical nitridation as described above. That is, the PSM 102 may not be formed by forming the gate insulating film of the second semiconductor layer 408 by means of thermal oxidation which is a high-temperature (800° C.) process because the wires, e.g., wires formed out of aluminum whose fusion point is 660° C., formed in the first semiconductor layer 400 melt. It is noted that although it is conceivable to form the wires by poly-silicon or the like whose fusion point is high in the first semiconductor layer 400, the performance of the PSM 102 degrades because resistance of the wires become high. Then, forming the gate insulating film in the second semiconductor layer 408 by means of the radical oxidation or the radical nitridation of low electronic temperature plasma (400° C.) allows the high performance PSM 102 to be formed because the wires in the first semiconductor layer 400 can be formed out of metal such as aluminum whose resistance is low.

Meanwhile, when the insulation of the gate insulating film of the MOSFETs 404 and 406 becomes higher than that of the gate insulating film of the MOSFETs 410 and 412 by forming the gate insulating film in the first semiconductor layer 400 by means of the thermal oxidation and forming the gate insulating film in the second semiconductor layer 408 by means of the radical oxidation or the radical nitridation as described above, the MOSFETs 404 and 406 may be made smaller than the MOSFETs 410 and 412 in order to unify electric characteristics of the MOSFETs 404 and 406 with that of the MOSFETs 410 and 412. In this case, gate voltage of the MOSFETs 404 and 406 is smaller than that of the MOSFETs 410 and 412 and operating speed of the MOSFETs 404 and 406 is higher than that of the MOSFETs 410 and 412.

Then, the PSM 102 may be operated effectively as a whole by operating the MOSFETs 404 and 406 or the MOSFETs 410 and 412 in accordance to their performance by discriminating signals to be transmitted between the MOSFETs 404 and 406 or between the MOSFETs 410 and 412 as follows. For instance, the MOSFETs 404 and 406 whose gate insulating film is formed by means of the thermal oxidation transmit high-frequency signals whose frequency is higher than predetermined frequency and the MOSFETs 410 and 412 whose gate insulating film is formed by means of the radical oxidation or the radical nitridation transmit low-frequency signals whose frequency is lower than the predetermined frequency. In another case, the MOSFETs 404 and 406 whose gate insulating film is formed by means of the thermal oxidation transmit analog signals and the MOSFETs 410 and 412 whose gate insulating film is formed by means of the radical oxidation or the radical nitridation transmit digital signals. It becomes possible to prevent the performance degradation of the PSM 102 which is otherwise caused by the performance degradation of the MOSFETs due to being formed by means of the radical oxidation or the radical nitridation by inputting/outputting the different types of signals corresponding to the different performances of the MOSFETs depending on whether the gate insulating films have been formed by the thermal oxidation and the radical oxidation or the radical nitridation.

Figure 14:
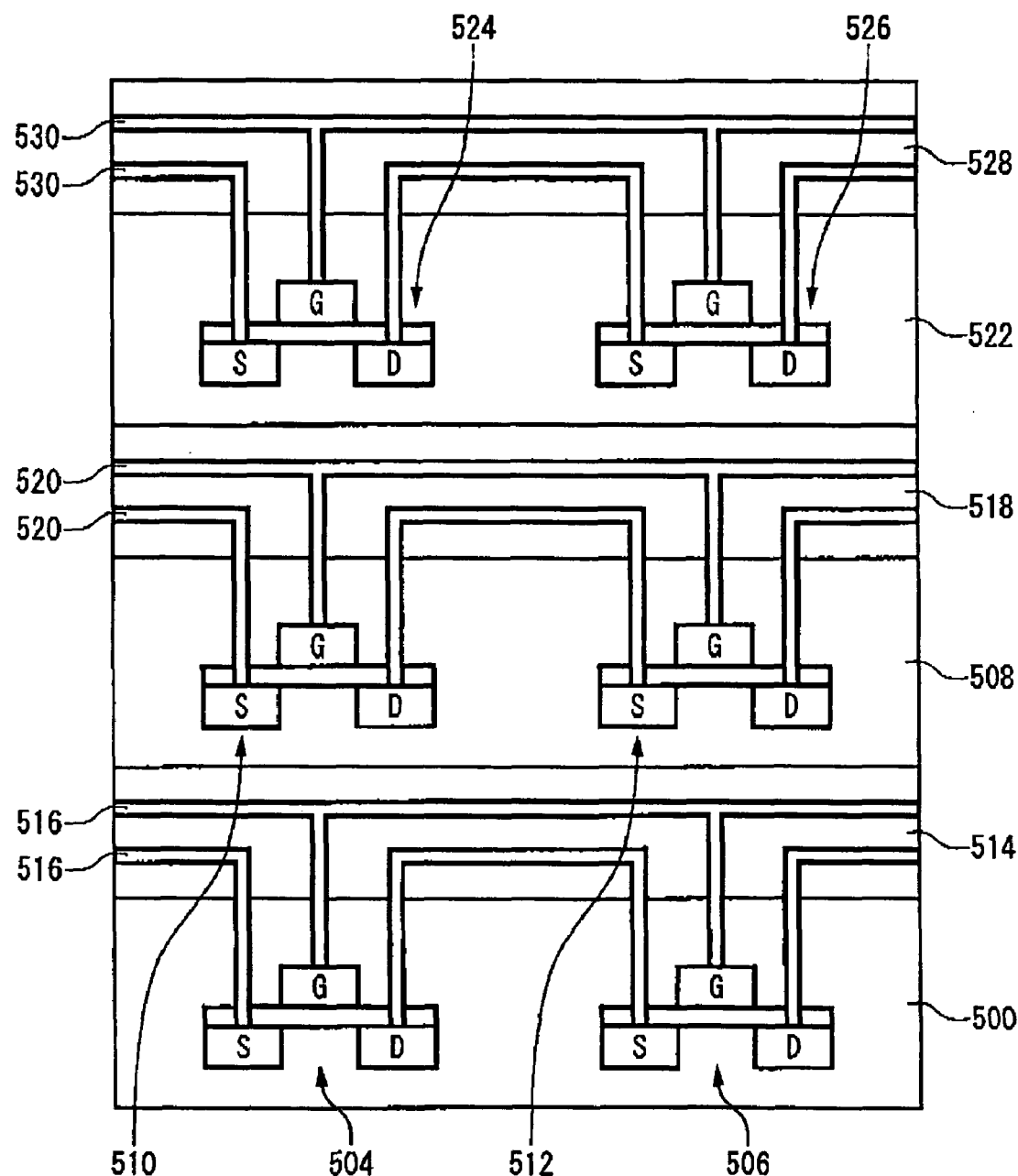
FIG. 14 is a schematic section view of another exemplary configuration of the PSM.

FIG. 14 is a schematic section view of another exemplary configuration of the PSM 102 of the first embodiment. The PSM 102 is provided with a first semiconductor layer 500 formed out of monocrystalline silicon, a plurality of MOSFETs 504 and 506 formed in the first semiconductor layer 500, a second semiconductor layer 508, i.e., the upper layer of the first semiconductor layer 500, formed out of polycrystalline silicon, a plurality of MOSFETs 510 and 512 formed in the second semiconductor layer 508, a third semiconductor layer 522, i.e., the upper layer of the second semiconductor layer 508, formed out of polycrystalline silicon, a plurality of MOSFETs 524 and 526 formed in the third semiconductor layer 522, a wiring layer 514 provided between the first semiconductor layer 500 and the second semiconductor layer 508, a wiring layer 518 provided between the second semiconductor layer 508 and the third semiconductor layer 522 and a wiring layer 528 which is the upper layer of the third semiconductor layer 522. The MOSFETs 504 and 506 are one example of the first semiconductor layer transistor of the invention, the MOSFETs 510 and 512 are one example of the second semiconductor layer transistor of the invention and the MOSFETs 524 and 526 are one example of the third semiconductor layer transistor.

Metal wires 516 for connecting the MOSFETs 504 and 506 formed in the first semiconductor layer 500 with the MOSFET 510, 512, 524 or 526 or with the outside such as the CLBs 104 are formed in the wiring layer 514. Metal wires 520 for connecting the MOSFETs 510 and 512 formed in the second semiconductor layer 508 with the MOSFET 504, 506, 524 or 526 or with the outside are formed in the wiring layer 518. Metal wires 530 for connecting the MOSFETs 524 and 526 formed in the third semiconductor layer 522 with the MOSFET 504, 506, 510 or 512 or with the outside are formed in the wiring layer 528. Preferably, at least a part of the MOSFET 504 or 506 overlaps with the MOSFET 510 and 512 in the direction from the first semiconductor layer 500 to the second semiconductor layer 508 and at least a part of the MOSFET 510 or 512 overlaps with the MOSFETs 524 and 526 in the direction from the second semiconductor layer 508 to the third semiconductor layer 522. Still more, the MOSFET 504 or 506 and the MOSFETs 524 and 526 may be formed in the same location in the second semiconductor layer 508 or in the third semiconductor layer 522. It allows the circuit area of the PSM 102 to be reduced.

Next, a manufacturing method of the PSM 102 will be explained. The first semiconductor layer 500 is formed at first and then the MOSFETs 504 and 506 are formed in the first semiconductor layer 500. In forming the MOSFETs 504 and 506 in the first semiconductor layer 500, a gate insulating film is formed by means of thermal oxidation in the first semiconductor layer 500 to form a first gate electrode. Next, the wiring layer 514 is deposited on the first semiconductor layer 500 to form the metal wires 516 formed out of metal such as aluminum in the wiring layer 514. Then, the second semiconductor layer 508 is deposited on the wiring layer 514 and the MOSFETs 510 and 512 are formed in the second semiconductor layer 508. In forming the MOSFETs 510 and 512 in the second semiconductor layer 508, a gate insulating film is formed by means of radical oxidation or radical nitridation electrode in the second semiconductor layer 508 to form a gate electrode.

Next, the wiring layer 518 is deposited on the second semiconductor layer 508 to form the metal wires 520 formed out of metal such as aluminum in the wiring layer 518. Then, the third semiconductor layer 522 is deposited on the wiring layer 518 and the MOSFETs 524 and 526 are formed in the third semiconductor layer 522. In forming the MOSFETs 524 and 526 in the third semiconductor layer 522, a gate insulating film is formed by means of radical oxidation or radical nitridation in the third semiconductor layer 522 to form a gate electrode. Then, the wiring layer 528 containing the wires 530 is formed. It is noted that the MOSFETs 510 and 512 are formed in the identical position of the second semiconductor layer 508 or the third semiconductor layer 522 so as to have the same structure through the same process by using a same photo mask.

The high performance PSM 102 may be fabricated by forming the gate insulating film of the first semiconductor layer 500 by means of the thermal oxidation and the gate insulating film of the second and third semiconductor layers 508 and 522 by means of the radical oxidation or the radical nitridation as described above. That is, the PSM 102 may not be formed by forming the gate insulating films of the second and third semiconductor layers 508 and 522 by means of thermal oxidation which is a high-temperature (800° C.) process because the wires, e.g., wires formed out of aluminum whose fusion point is 660° C., formed in the first and second semiconductor layers 500 and 508 melt. It is noted that although it is conceivable to form the wires by polysilicon or the like whose fusion point is high in the first and second semiconductor layers 500 and 508, the performance of the PSM 102 degrades because resistance of the wires become high. Then, forming the gate insulating films in the second and third semiconductor layers 508 and 522 by means of the radical oxidation or the radical nitridation of low electronic temperature plasma (400° C.) allows the high performance PSM 102 to be formed because the wires in the first semiconductor layer 500 may be formed out of metal such as aluminum whose resistance is low.

Because the same photo mask may be repeatedly used by forming the MOSFET 504 or 506 and the MOSFETs 524 and 526 with the same layout pattern at the identical location of the second semiconductor layer 508 or the third semiconductor layer 522, the cost of the mask may be reduced. Still more, because no via-hole needs to be perforated in the second and third semiconductor layers 508 and 522 by providing the wiring layer 514 between the first semiconductor layer 500 and the second semiconductor layer 508 and the wiring layer 518 between the second semiconductor layer 508 and the third semiconductor layer 522, the integration of the circuits may be improved and the circuit area may be reduced.

The insulation of the gate insulating film of the MOSFETs 504 and 506 is almost equal to that of the gate insulating films of the MOSFETs 510, 512, 524 and 526 even if the gate insulating film of the first semiconductor layer 500 is formed by means of the thermal oxidation and the gate insulating film of the second semiconductor layer 508 is formed by means of the radial oxidation or the radial nitridation. It is noted that the performance of the gate insulating film formed by means of the radical oxidation or the radical nitridation as compared to the gate insulating film formed by means of the thermal oxidation will be explained in conjunction with FIGS. 21 and 22.

Meanwhile, when the insulation of the gate insulating film of the MOSFETs 504 and 506 becomes higher than that of the gate insulating film of the MOSFETs 510, 512, 524 and 526 and the insulation of the gate insulating film of the MOSFETs 510 and 512 is almost equal with that of the gate insulating film of the MOSFETs 524 and 526 by forming the gate insulating film in the first semiconductor layer 500 by means of the thermal oxidation and forming the gate insulating films in the second and third semiconductor layers 508 and 522 by means of the radical oxidation or the radical nitridation as described above, the MOSFETs 504 and 506 may be made smaller than the MOSFETs 510, 512, 524 and 526 and the MOSFETs 510 and 512 may be made almost equally with the MOSFETs 524 and 526 in order to unify the electric characteristics of the MOSFETs 504 and 506 with that of the MOSFETs 510, 512, 524 and 526.

In this case, gate voltage of the MOSFETs 504 and 506 is smaller than that of the MOSFETs 510, 512, 524 and 526 and the gate voltage of the MOSFETs 510 and 512 is almost equal with that of the MOSFETs 524 and 526. Still more, operating speed of the MOSFETs 504 and 506 is higher than that of the MOSFETs 510, 512, 524 and 526 and the operating speed of the MOSFETs 510 and 512 is almost equal with that of the MOSFETs 524 and 526.

Then, the PSM 102 maybe operated effectively as a whole by operating the MOSFETs 504 and 506 or the MOSFETs 510, 512, 524 and 526 in accordance to their performance by discriminating signals to be transmitted among the MOSFETs 504 and 506 or the MOSFETs 510, 512, 524 and 526 as follows. For instance, the MOSFETs 504 and 506 whose gate insulating film is formed by means of the thermal oxidation transmit high-frequency signals whose frequency is higher than predetermined frequency and the MOSFETs 510, 512, 524 and 526 whose gate insulating films are formed by means of the radical oxidation or the radical nitridation transmit low-frequency signals whose frequency is lower than the predetermined frequency. In another case, the MOSFETs 504 and 506 whose gate insulating film is formed by means of the thermal oxidation transmit analog signals and the MOSFETs 510, 512, 524 and 526 whose gate insulating films are formed by means of the radical oxidation or the radical nitridation transmit digital signals. It becomes possible to prevent the drop of the performance of the PSM 102 which is otherwise caused by the drop of performance of the MOSFETs formed by means of the radical oxidation or the radical nitridation by inputting/outputting the different types of signals corresponding to the different performances of the MOSFETs depending on whether the gate insulating films have been formed by the thermal oxidation and the radical oxidation or the radical nitridation.

Figure 15:
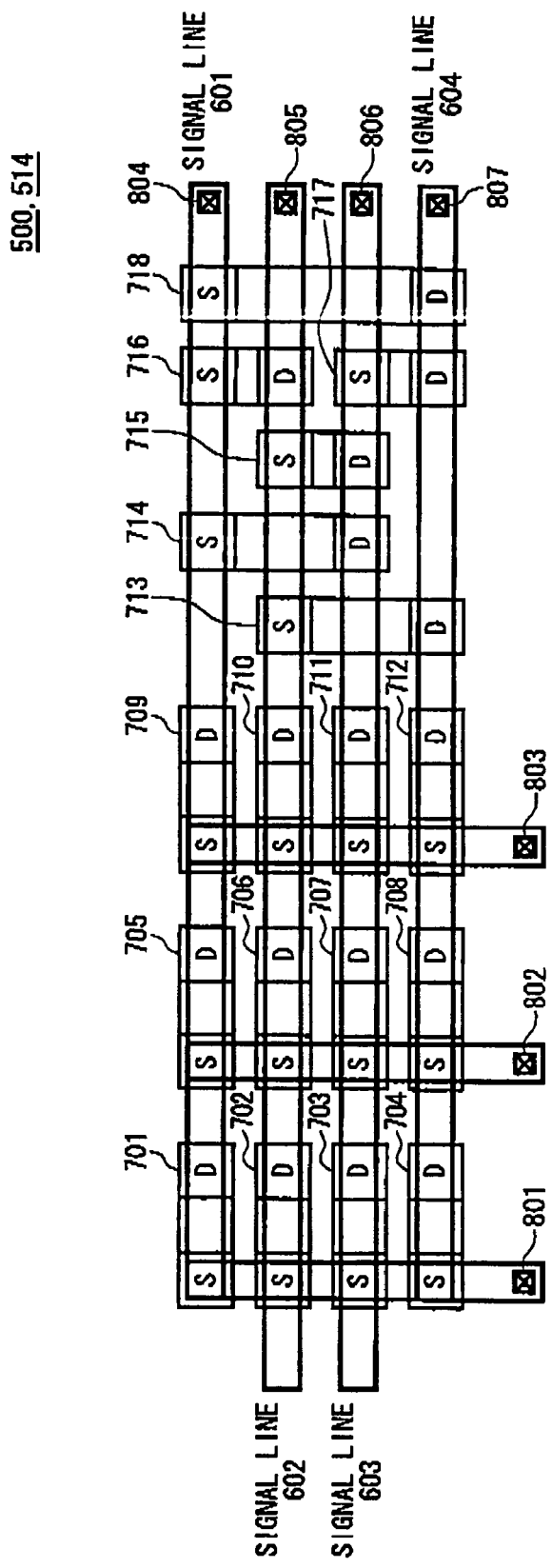
FIG. 15 is a schematic plan view of a first semiconductor layer and a wiring layer.
Figure 16:
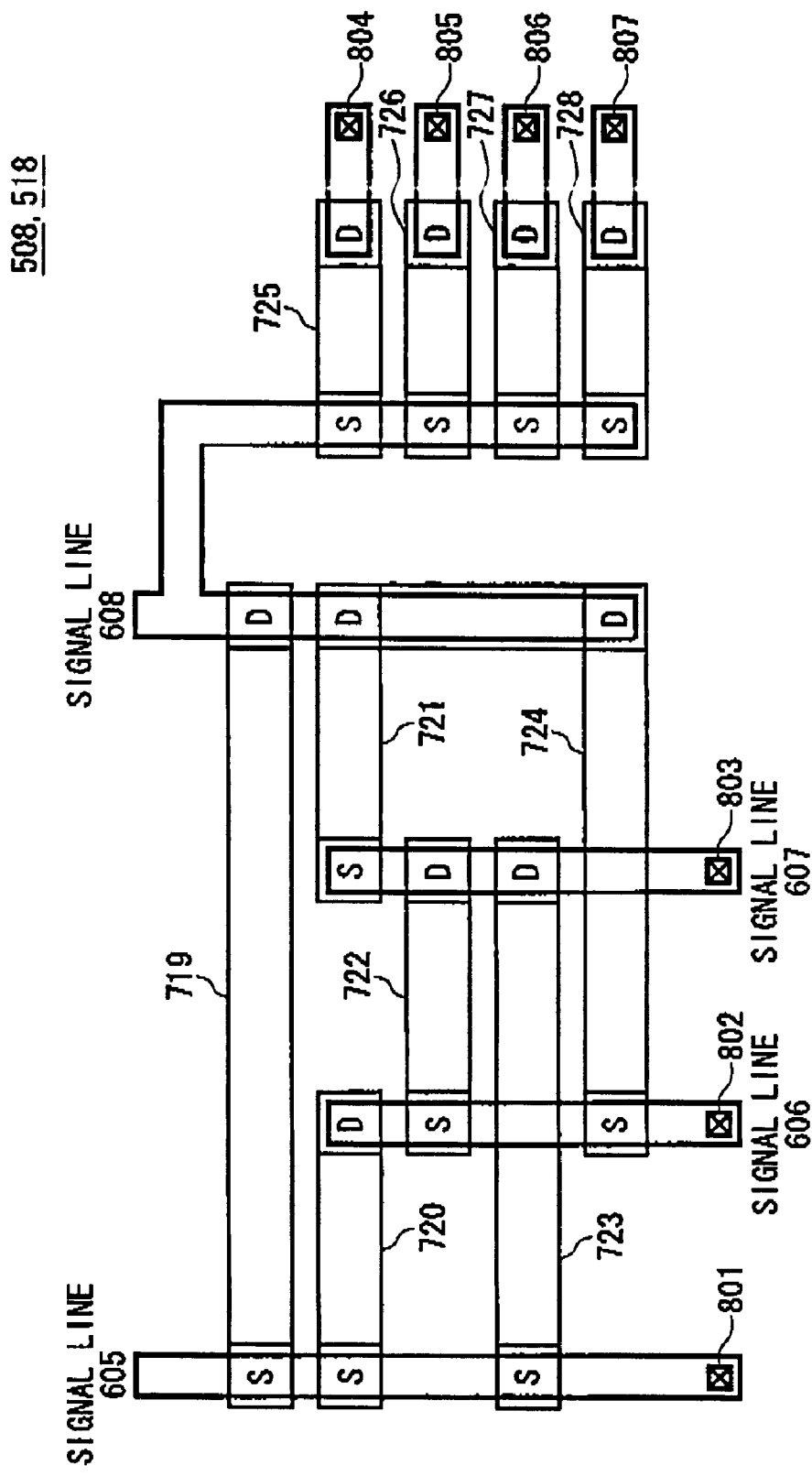
FIG. 16 is a schematic plan view of a second semiconductor layer and a wiring layer.

FIGS. 15 and 16 are schematic plan views showing one exemplary configuration of the PSM 102 of the first embodiment, wherein FIG. 15 is a plan view of the first semiconductor layer 500 and the wiring layer 514 and FIG. 16 is a schematic plan view of the second semiconductor layer 508 and the wiring layer 518.

MOSFETs 701 through 718 are formed in the first semiconductor layer 500 as shown in FIG. 15 and MOSFETs 719 through 728 are formed in the second semiconductor layer 508 as shown in FIG. 16. The PSM 102 is a PSM of eight input/outputs for switching connections among a plurality of signal lines 601 through 608. The MOSFETs 701 through 728 are mutually connected by the wires formed in the wiring layers 514 and 518 and by through holes 801 through 807 and switch any one of connections among the plurality of signal lines 601 through 608, respectively.

In concrete, the MOSFET 701 switches the connection between the signal line 601 and the signal line 605, the MOSFET 702 switches the connection between the signal line 602 and the signal line 605, the MOSFET 703 switches the connection between the signal line 603 and the signal line 605, the MOSFET 704 switches the connection between the signal line 604 and the signal line 605, the MOSFET 705 switches the connection between the signal line 601 and the signal line 606, the MOSFET 706 switches the connection between the signal line 602 and the signal line 606, the MOSFET 707 switches the connection between the signal line 603 and the signal line 606, the MOSFET 708 switches the connection between the signal line 604 and the signal line 606, the MOSFET 709 switches the connection between the signal line 601 and the signal line 607, the MOSFET 710 switches the connection between the signal line 602 and the signal line 607, the MOSFET 711 switches the connection between the signal line 603 and the signal line 607, the MOSFET 712 switches the connection between the signal line 604 and the signal line 607, the MOSFET 713 switches the connection between the signal line 602 and the signal line 604, the MOSFET 714 switches the connection between the signal line 601 and the signal line 603, the MOSFET 715 switches the connection between the signal line 602 and the signal line 603, the MOSFET 716 switches the connection between the signal line 601 and the signal line 602, the MOSFET 717 switches the connection between the signal line 603 and the signal line 604 and the MOSFET 718 switches the connection between the signal line 601 and the signal line 604, respectively.

Still more, the MOSFET 719 switches the connection between the signal line 605 and the signal line 608, the MOSFET 720 switches the connection between the signal line 605 and the signal line 606, the MOSFET 721 switches the connection between the signal line 607 and the signal line 608, the MOSFET 722 switches the connection between the signal line 606 and the signal line 607, the MOSFET 723 switches the connection between the signal line 605 and the signal line 607, the MOSFET 724 switches the connection between the signal line 606 and the signal line 608, the MOSFET 725 switches the connection between the signal line 601 and the signal line 608, the MOSFET 726 switches the connection between the signal line 602 and the signal line 608, the MOSFET 727 switches the connection between the signal line 603 and the signal line 608 and the MOSFET 728 switches the connection between the signal line 604 and the signal line 608, respectively.

Figure 1:
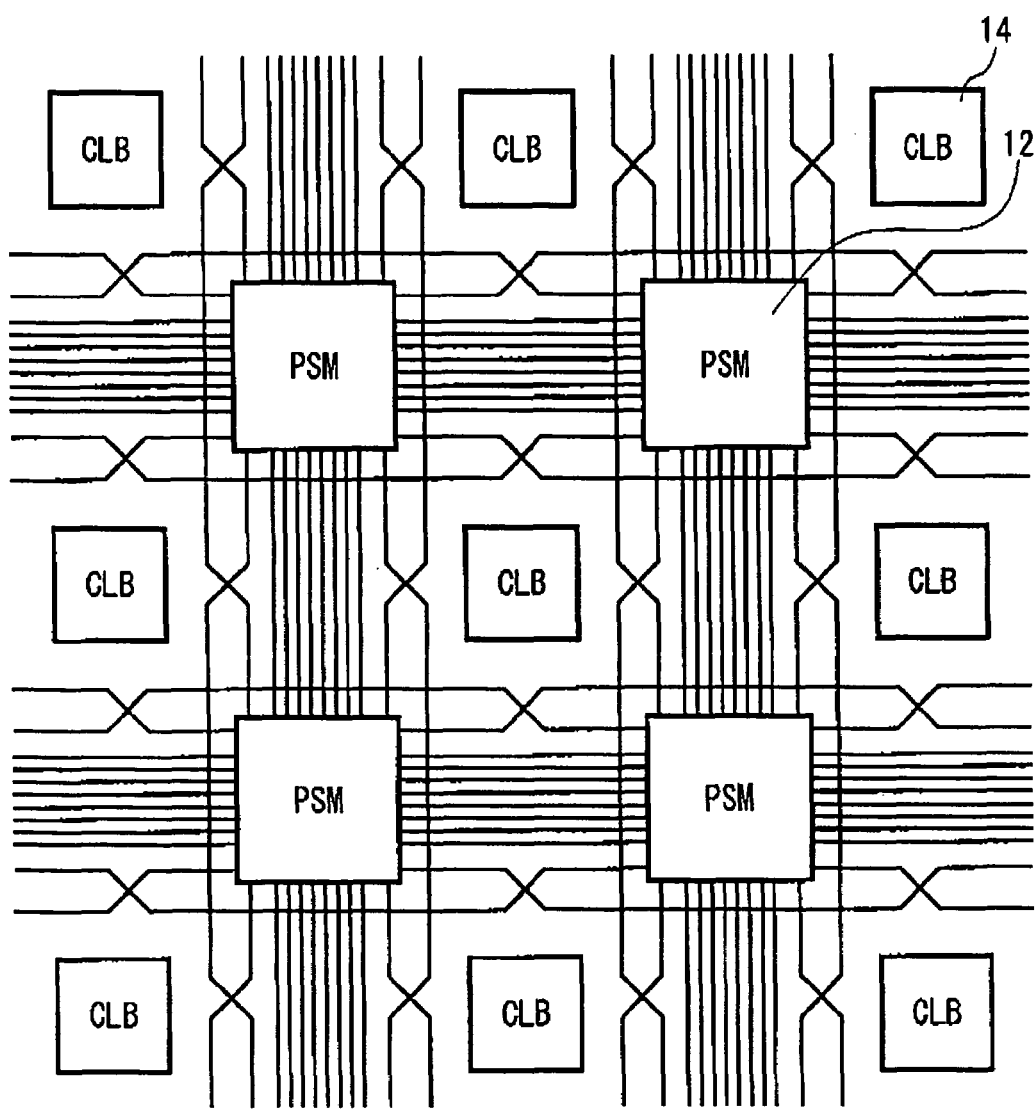
FIG. 1 is a diagram showing a configuration of a semiconductor integrated circuit.
Figure 2:
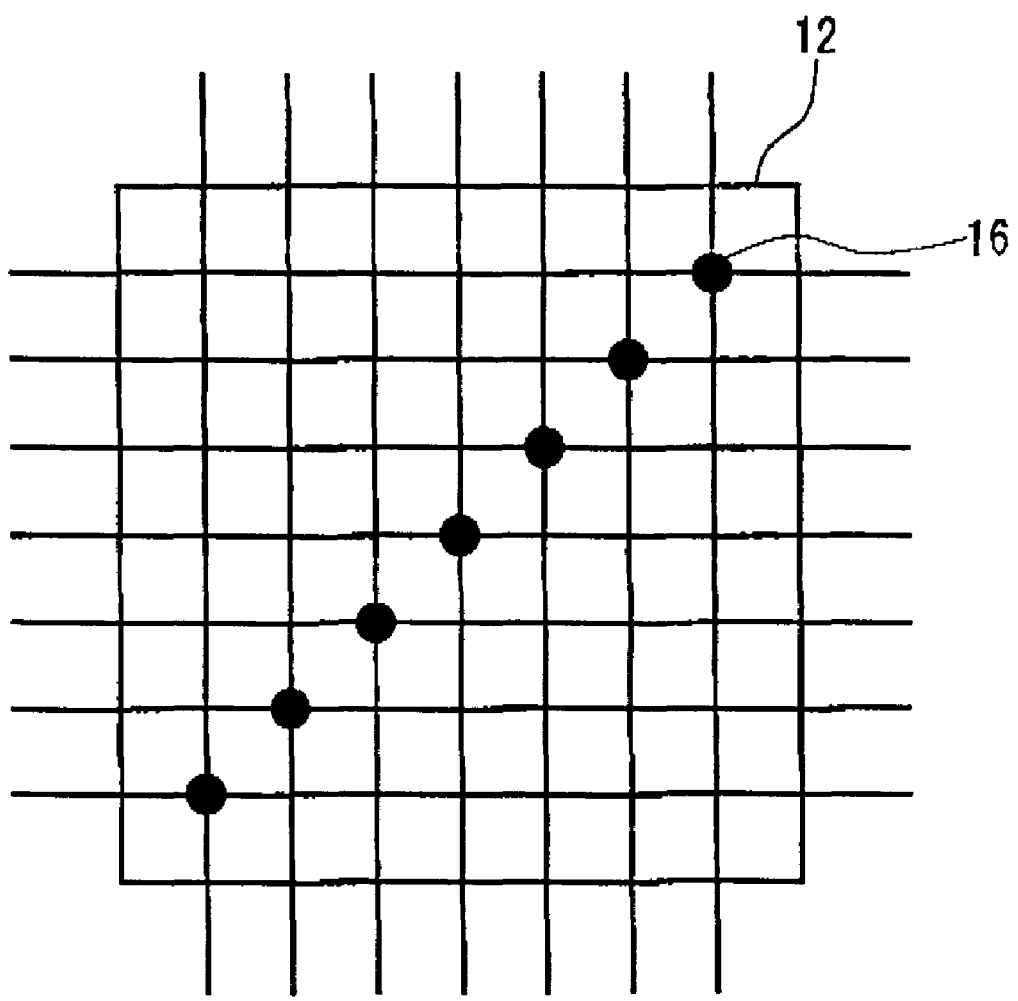
FIG. 2 is a diagram showing a configuration of a PSM.
Figure 3:
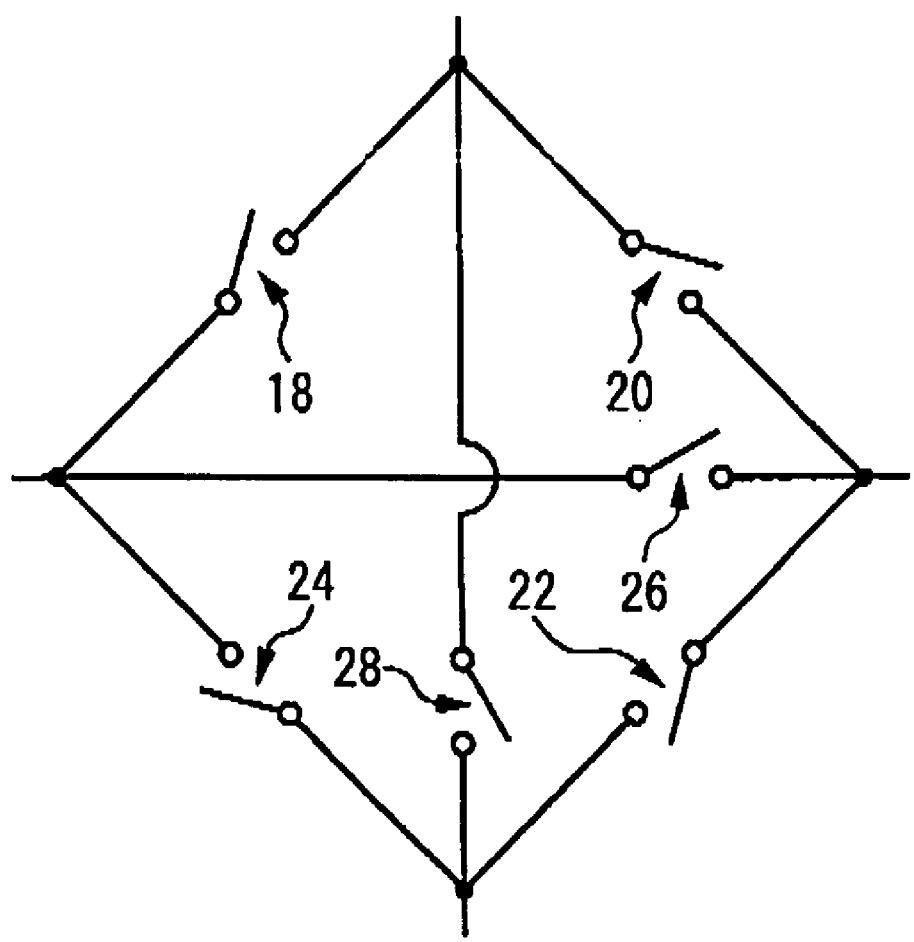
FIG. 3 is a diagram showing a configuration of a programmable switch.
Figure 4:
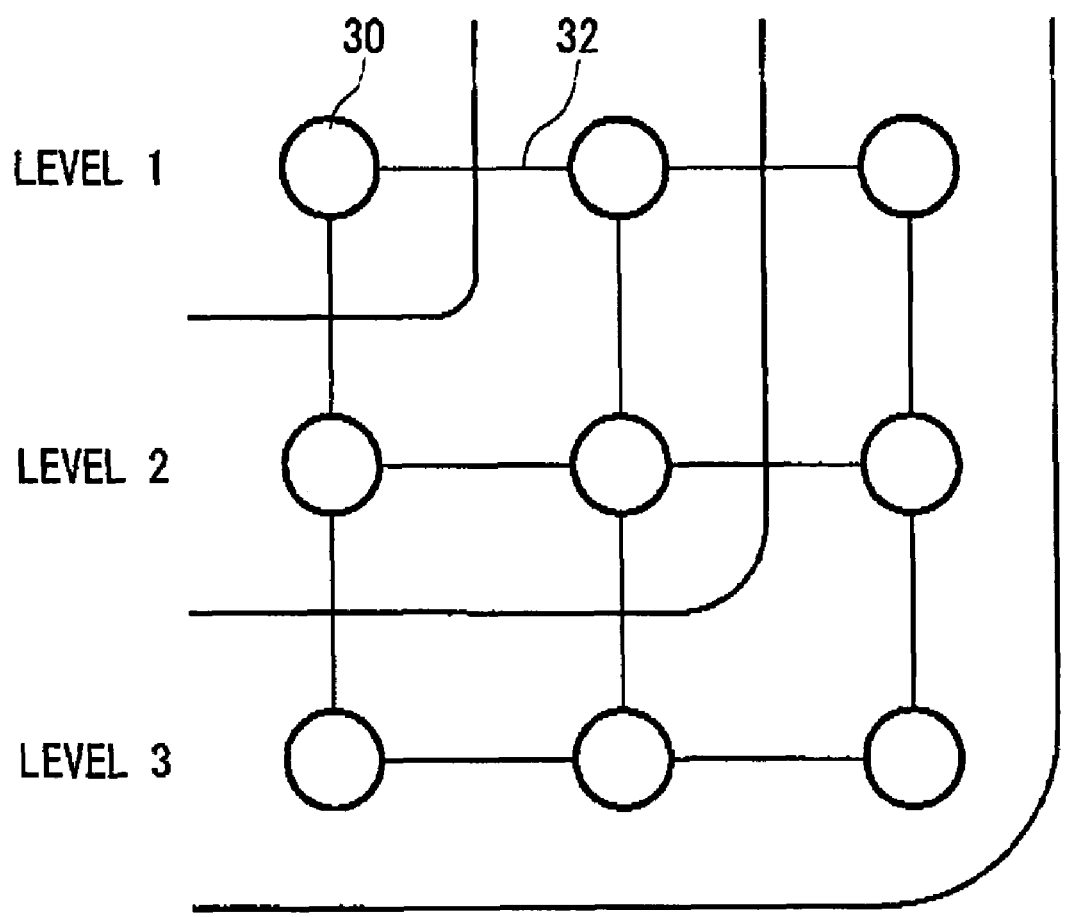
FIG. 4 is a graphed representation of the mesh-type semiconductor integrated circuit.
Figure 5:
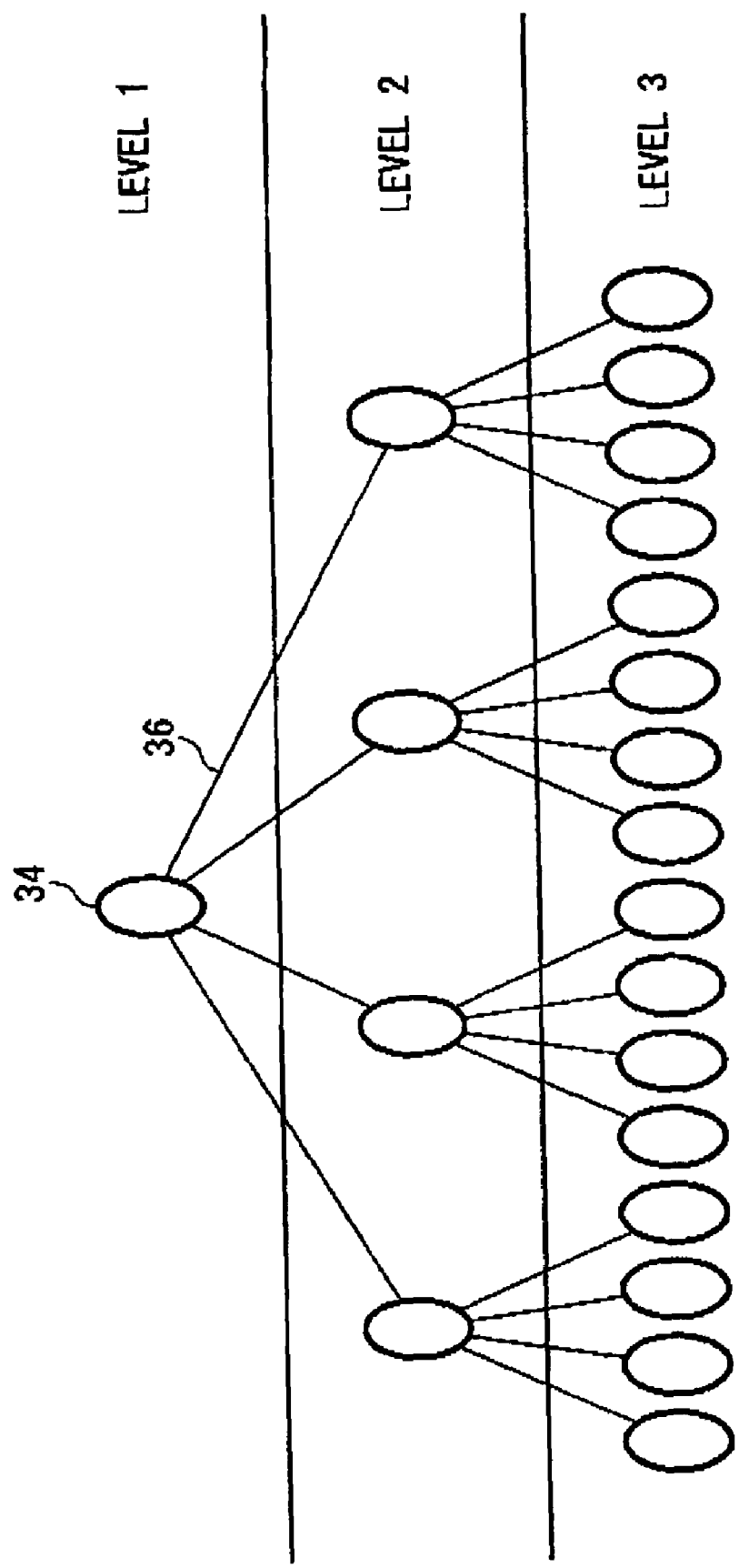
FIG. 5 is a graphed representation of a tree-type semiconductor integrated circuit.
Figure 6:
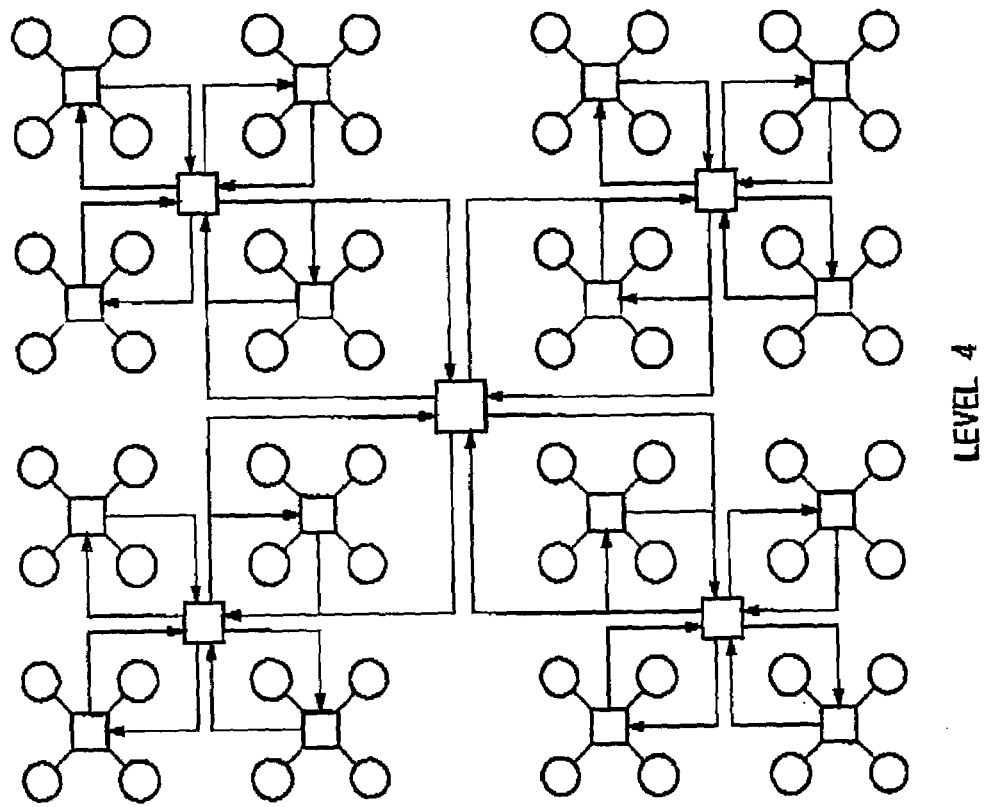
FIG. 6 is a graphed representation of the tree-type semiconductor integrated circuit.
Figure 6:
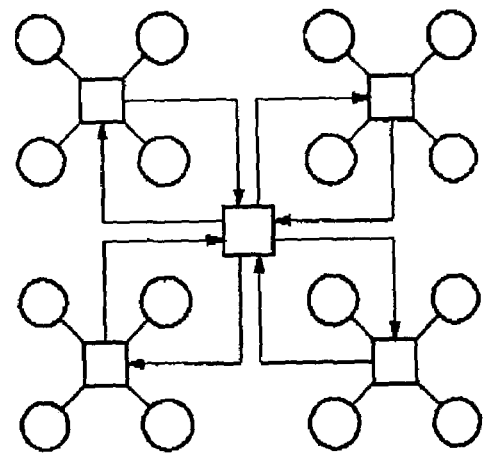
Figure 6:
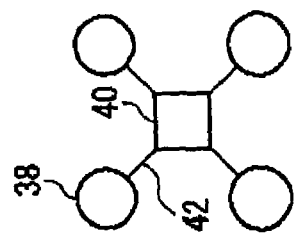
Figure 7:
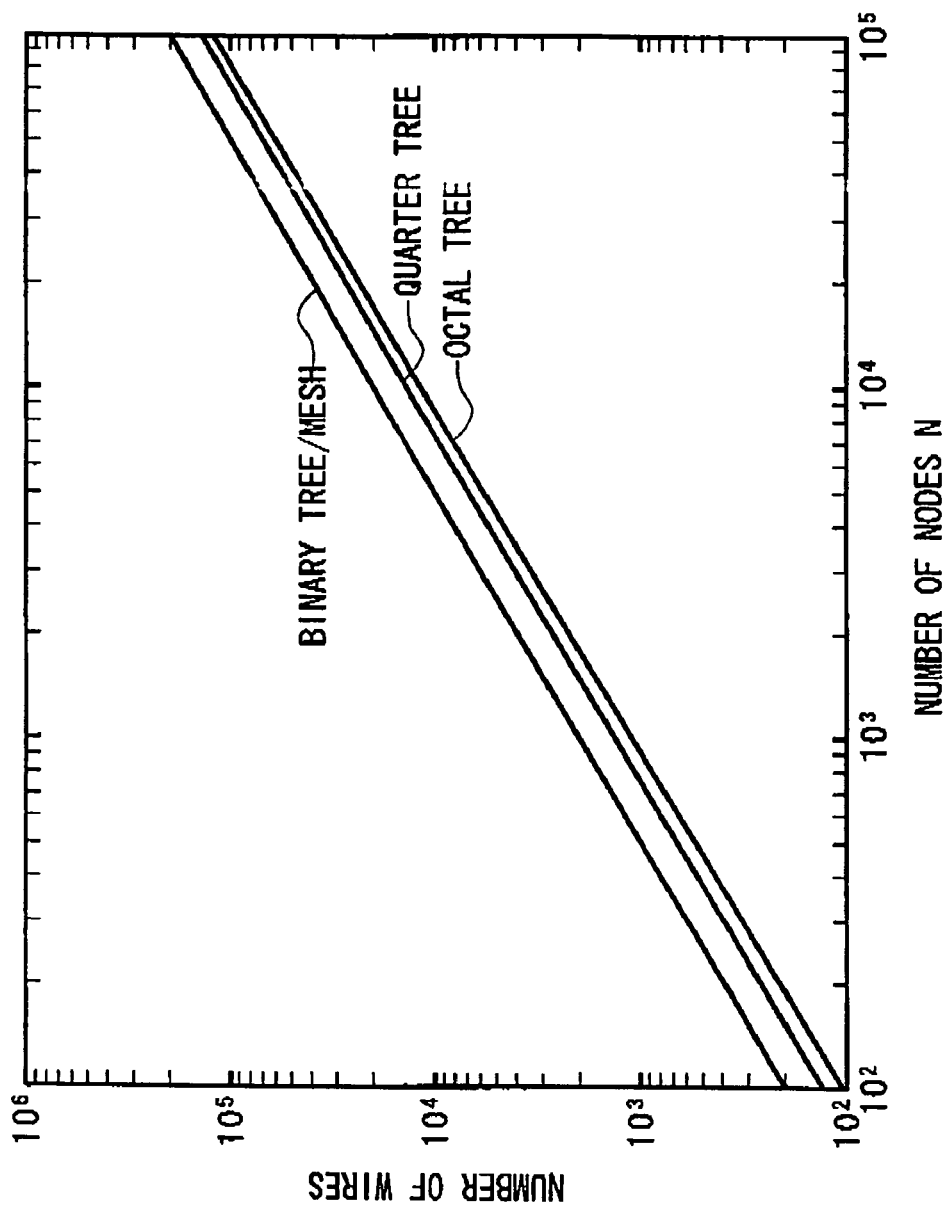
FIG. 7 is a graph showing the relationship between a number of nodes N and a number of wires.
Figure 8:
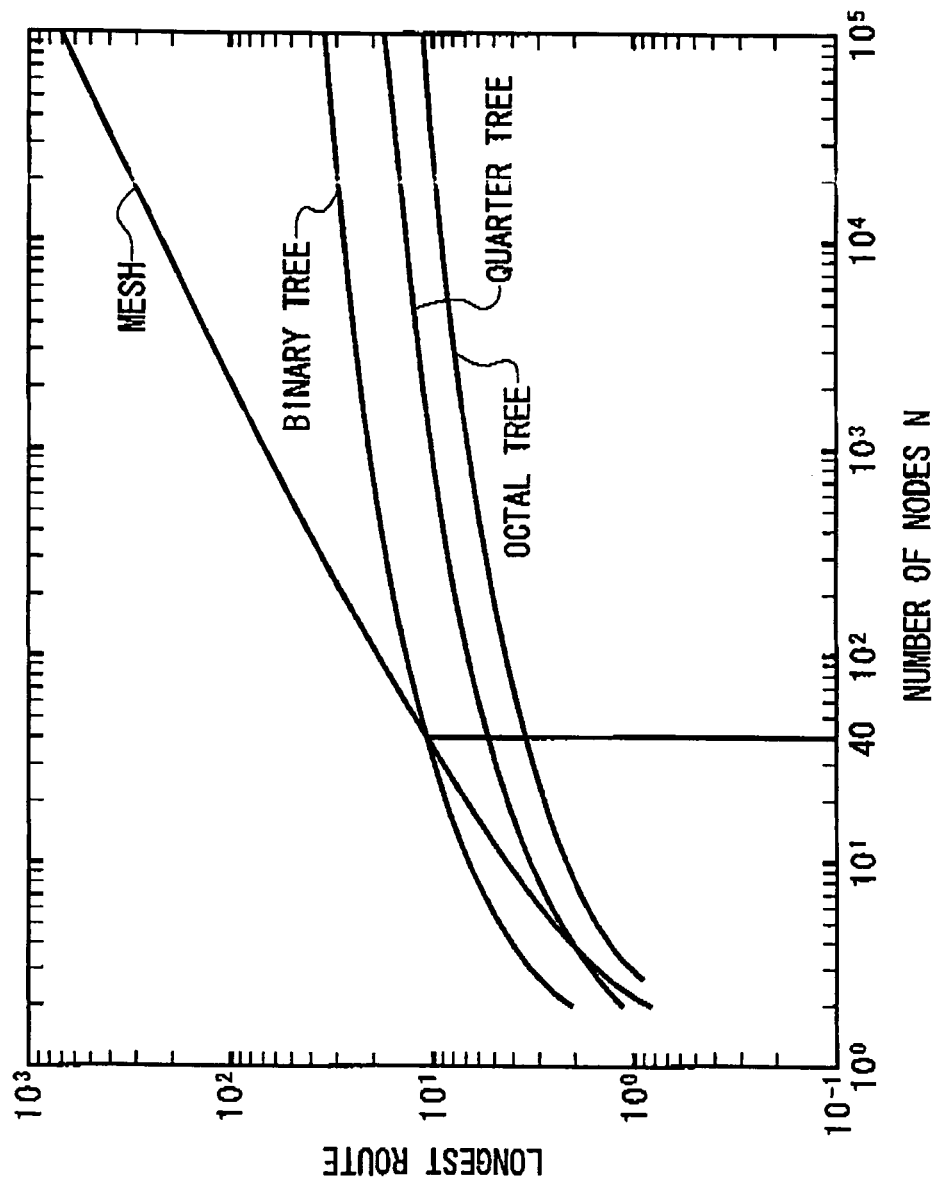
FIG. 8 is a graph showing the relationship between the number of nodes N and a longest path.
Figure 9:
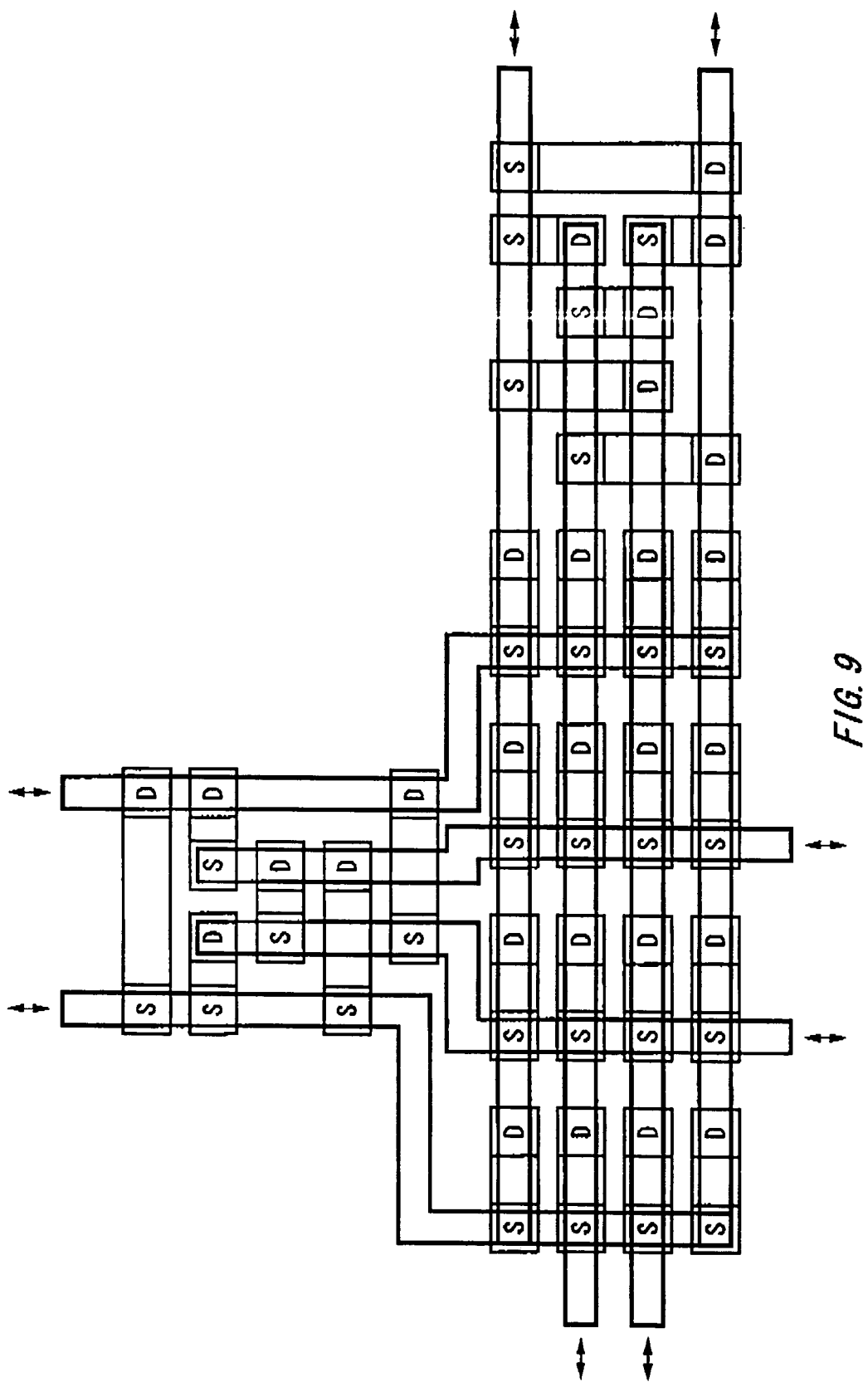
FIG. 9 is a schematic plan view of the PSM having eight input/outputs.

As it is apparent from the comparison with the conventional PSM of eight input/outputs in FIG. 9, the circuit area of the PSM 102 may be reduced by constructing the PSM 102 by partitioning the MOSFETs 701 through 728 into the first and second semiconductor layers 500 and 508 and by integrating them as described above. Because a chip area may be reduced, wiring length may be shortened as well. As a result, a wire delay time is reduced and the circuit may be operated at high-speed.

Still more, when the MOSFETs 719 through 728 become larger than the MOSFETs 701 through 718 by forming gate insulating films of the MOSFETs 701 through 718 in the first semiconductor layer 500 by means of the thermal oxidation and by forming gate insulating films of the MOSFETs 719 through 728 in the second semiconductor layer 508 by means of the radical oxidation or the radical nitridation as explained in conjunction with FIGS. 13 and 14, the number of the MOSFETs formed in the second semiconductor layer 508 is preferred to be smaller than the number of the MOSFETs formed in the first semiconductor layer 500. Because it allows the area of the circuit formed in the first semiconductor layer 500 to be almost equal to that of the circuit formed in the second semiconductor layer 508, the chip area of the PSM 102 may be reduced.

Figure 17:
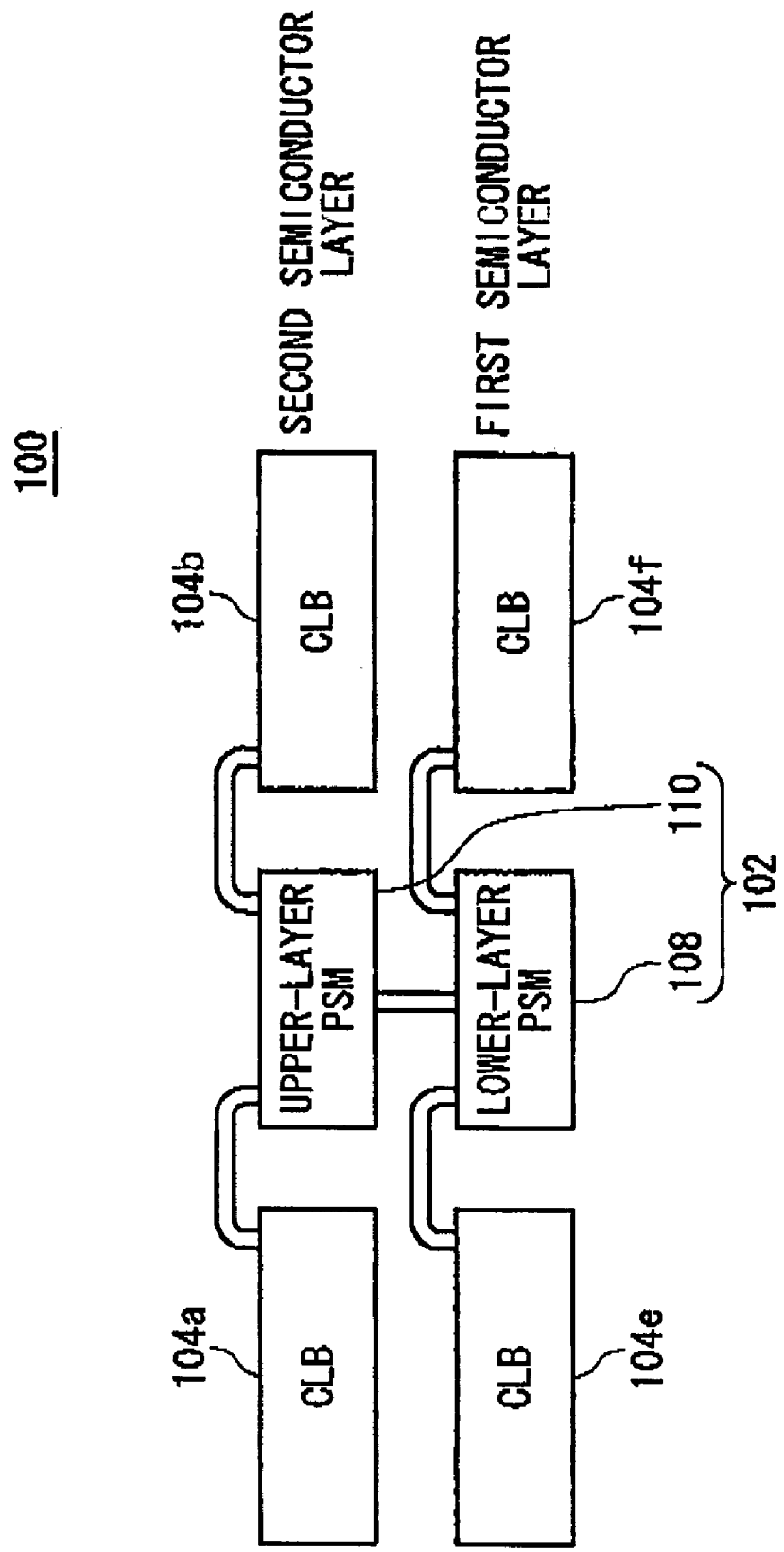
FIG. 17 is a schematic section view of another configuration of the semiconductor integrated circuit.
Figure 18:
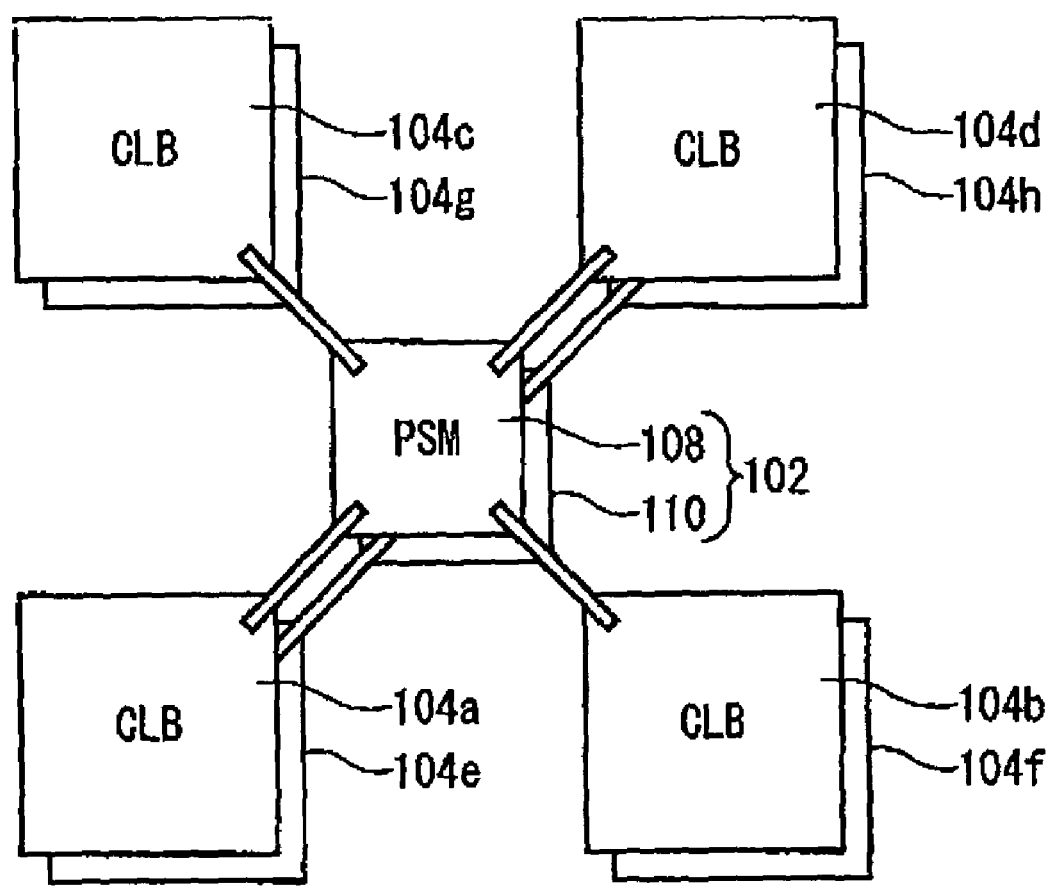
FIG. 18 is a schematic plan view of the configuration of the semiconductor integrated circuit.

FIGS. 17 and 18 show one example of the configurations of the semiconductor integrated circuit 100 of the first embodiment, wherein FIG. 17 is a schematic section view of the configuration of the semiconductor integrated circuit 100 and FIG. 18 is a schematic plan view of the configuration of the semiconductor integrated circuit 100.

The semiconductor integrated circuit 100 is provided with the PSM 102 having a lower-layer PSM 108 and an upper-layer PSM 110 and a plurality of CLBs 104a through 104h. The lower-layer PSM 108 is a part of the PSM 102 formed in the first semiconductor layer shown in FIG. 16 and the upper-layer PSM 110 is a part of the PSM 102 formed in the second semiconductor layer shown in FIG. 15.

The CLBs 104a through 104d are one example of the second semiconductor layer logic block of the invention and are formed in the second semiconductor layer. The CLBs 104e through 104h are one example of the first semiconductor layer logic block of the invention and are formed in the first semiconductor layer. Then, the CLBs 104a through 104h are mutually connected and are switched by the MOSFETs of the lower-layer PSM 108 or the upper-layer PSM 110. It is noted that the CLBs 104a through 104d and the CLBs 104e through 104h are preferable to be formed in the identical location in the first or second semiconductor layer. It allows the circuit area of the semiconductor integrated circuit 100 to be reduced.

Preferably, the CLBs 104a through 104d formed in the second semiconductor layer are mutually connected by any one of the plurality of MOSFETs of the upper-layer PSM 110 formed in the second semiconductor layer. Still more, the CLBs 104e through 104h formed in the first semiconductor layer are preferable to be mutually connected by any one of the plurality of MOSFETs formed in the first semiconductor layer. The wiring length among the CLBs may be shortened by connecting the CLBs formed in the same semiconductor layer through the intermediary of the MOSFETs formed in the same semiconductor layer.

Still more, because the gate insulating film of the MOSFETs of the lower-layer PSM 108 is formed by means of the thermal oxidation and the gate insulating film of the MOSFETs of the upper-layer PSM 110 is formed by means of the radical oxidation or the radical nitridation as explained in conjunction with FIG. 13, the performance of the lower-layer PSM 108 is higher than that of the upper-layer PSM 110, Therefore, it is preferable to mutually connect the CLBs 104a through 104d formed in the first semiconductor layer with the CLBs 104e through 104h formed in the second semiconductor layer through the intermediary of the MOSFETs of the lower-layer PSM 108 formed in the first semiconductor layer.

From the same reason, it is also preferable to mutually connect the CLBs 104a through 104h inputting/outputting digital signals by any one of the plurality of MOSFETs of the lower-layer PSM 108 formed in the first semiconductor layer and to mutually connect the CLBs 104a through 104h inputting/outputting analog signals by the plurality of MOSFETs of the upper-layer PSM 110 formed in the second semiconductor layer. It is also preferable to mutually connect the CLBs 104a through 104h inputting/outputting high-frequency signals whose frequency is higher than predetermined frequency by any one of the plurality of MOSFETs of the lower-layer PSM 108 formed in the first semiconductor layer and to mutually connect the CLBs 104a through 104h inputting/outputting low-frequency signals whose frequency is lower than the predetermined frequency by any one of the plurality of MOSFETs of the upper-layer PSM 110 formed in the second semiconductor layer.

The semiconductor integrated circuit 100 may be operated effectively as a whole by preventing the drop of performance of the PSM 102 which is otherwise caused by the lower performance of the MOSFETs formed by means of the radical oxidation or the radical nitridation by selecting the MOSFETs based on the performance of the CLBs 104a through 104h.

Figure 19:
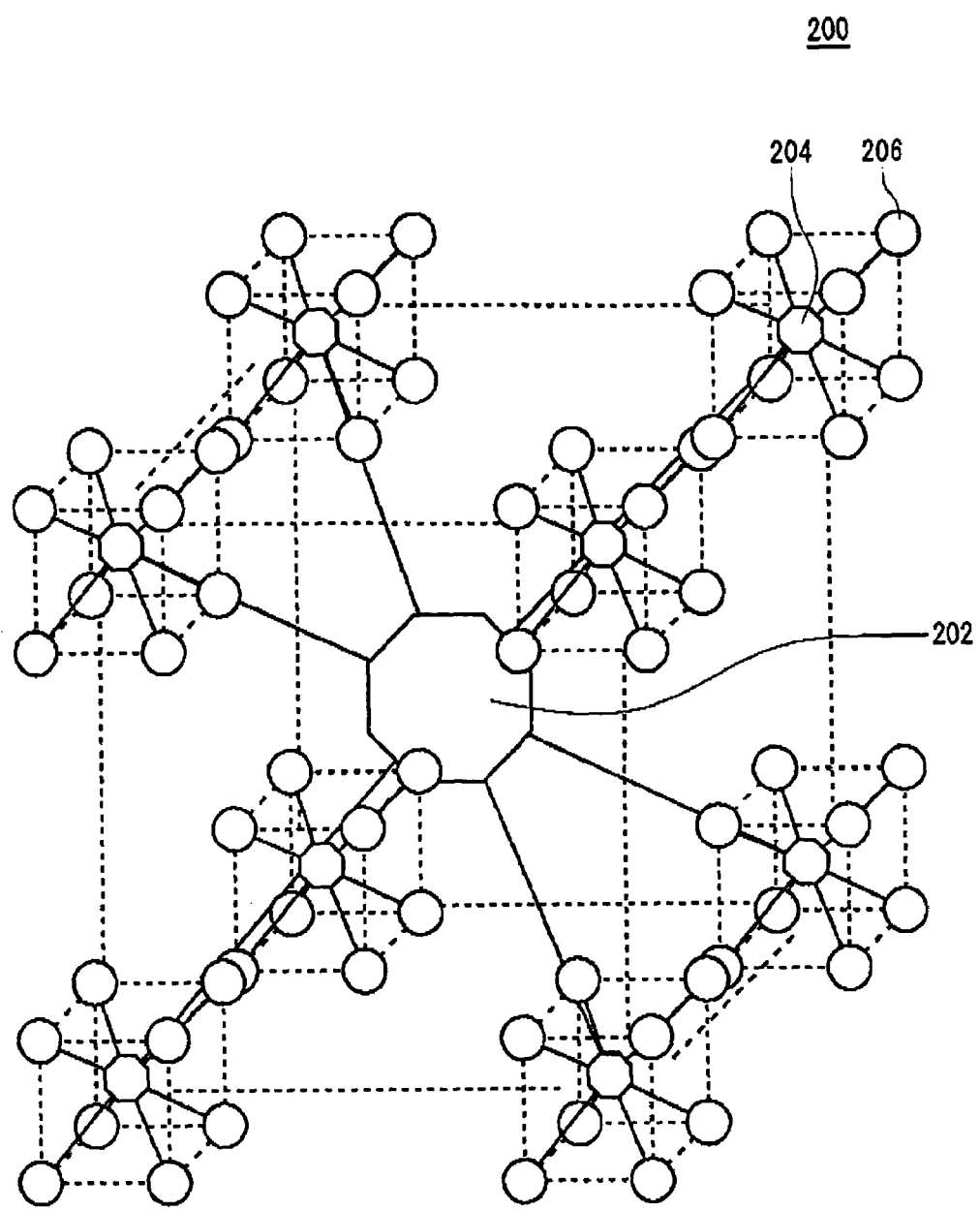
FIG. 19 is a graphed representation of one example of a semiconductor integrated circuit.

FIG. 19 is a graphed representation of one example of a semiconductor integrated circuit 200 according to a second embodiment of the invention. Except of the parts explained below, the structure, function, operation, effect and the like of the semiconductor integrated circuit 200 of the second embodiment are the same with those of the semiconductor integrated circuit 100 of the first embodiment.

The semiconductor integrated circuit 200 is provided with a PSM 202, a plurality of PSMs 204 and a plurality of CLBs 206. In this example, the PSM 202 has eight input/outputs and is connected with the eight CLBs 206. That is, the semiconductor integrated circuit 200 has the octal tree-type wiring structure on Level 3. The PSMs 202 and 204 are one example of the inventive switch block and are programmable switch blocks which are capable of changing the connection topology among the plurality of signal lines based on setting from the outside. The CLBs 206 are one example of the inventive logic block and are programmable logic blocks which are capable of changing operations of the logical circuits based on setting from the outside.

The PSM 202 switches connections among a plurality of signal lines connected to each of the plurality of PSMs 204 by a plurality of MOSFETs formed respectively in the plurality of semiconductor layers. The plurality of PSMs 204 switch connections among the plurality of signal lines connected to the PSM 202 and the plurality of CLBs 206 by a plurality of MOSFETs formed respectively in the plural semiconductor layers. The plurality of CLBs 206 are formed respectively in the plurality of semiconductor layers and are connected respectively to the plurality of signal lines connected to the PSMs 204.

The programmable semiconductor integrated circuit 100 having the tree-type wiring structure may be implemented in a small circuit area by constructing the PSM 202, the PSMs 204 and the CLBs 206 in the multi-layered structure as described above.

Figure 20:
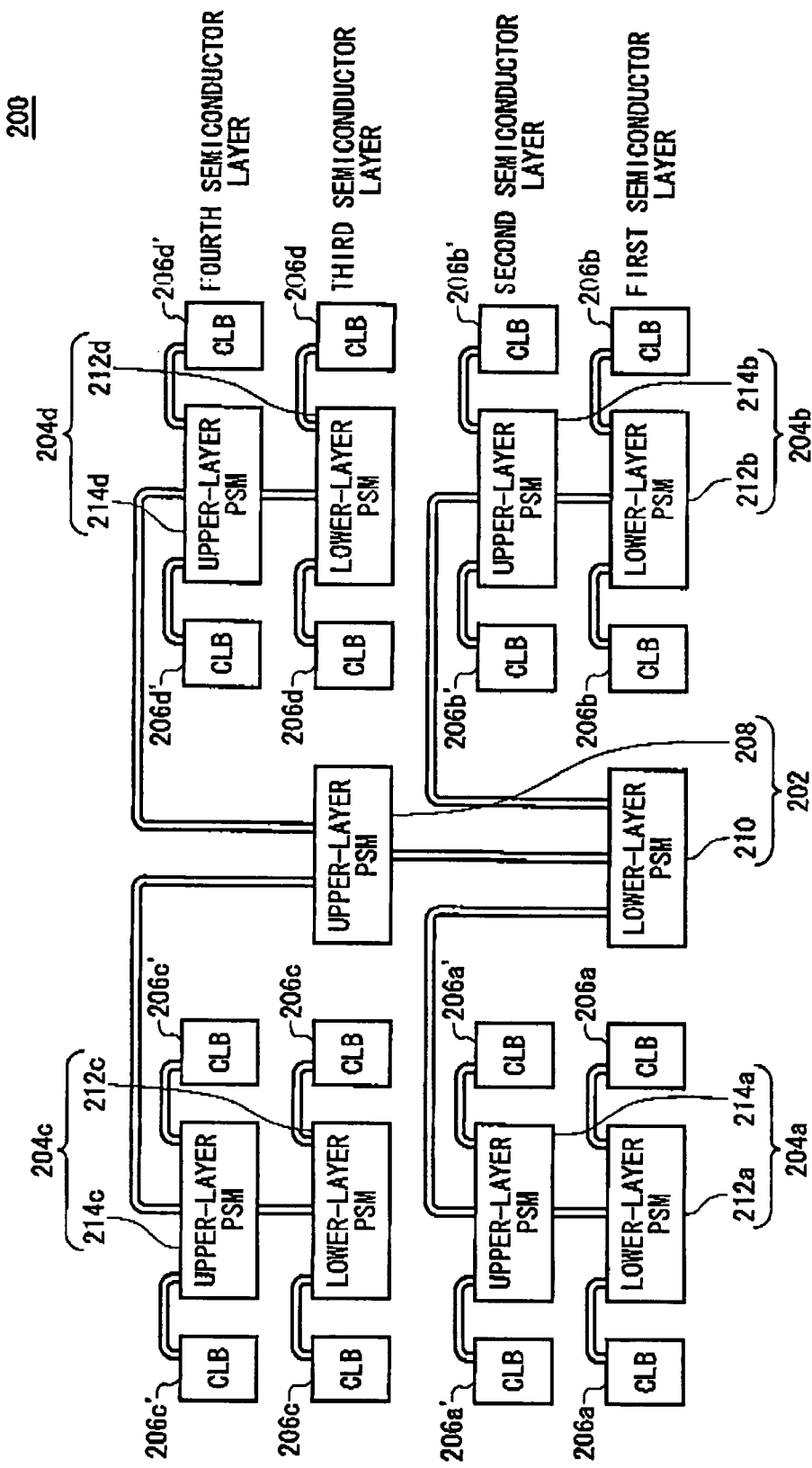
FIG. 20 is a diagram showing a configuration of the semiconductor integrated circuit.

FIG. 20 is a diagram showing one exemplary configuration of the semiconductor integrated circuit 200 of the second embodiment.

The semiconductor integrated circuit 200 is provided with the PSM 202 having an upper-layer PSM 208 and a lower-layer PSM 210, a PSM 204a having a lower-layer PSM 212a and an upper-layer PSM 214a, a PSM 204b having a lower-layer PSM 212b and an upper-layer PSM 214b, a PSM 204c having a lower-layer PSM 212c and an upper-layer PSM 214c, a PSM 204d having a lower-layer PSM 212d and an upper-layer PSM 214d, a PSM 204e having a lower-layer PSM 212e and an upper-layer PSM 214e, a PSM 204f having a lower-layer PSM 212f and an upper-layer PSM 214f, a PSM 204g having a lower-layer PSM 212g and an upper-layer PSM 214g, a PSM 204h having a lower-layer PSM 212h and an upper-layer PSM 214h and a plurality of CLBs 206a through 206h and CLBs 206a' through 206h'. It is noted that the PSMs 204e through 204h and the CLBs 206e through 204h are not shown in the figure.

It is also noted that the PSM 202 is one example of the inventive first switch block and has the structure shown in FIG. 13 or 14. The whole body including the PSM 204a, CLB 206a and CLB 206a' is one example of the inventive first logic block. In the same manner, the whole body including the PSM 204b, CLB 206b and CLB 206b', the whole body including the PSM 204c, CLB 206c and CLB 206c' and the whole body including the PSM 204d, CLB 206d and CLB 206d' are, respectively, one example of the inventive first logic block. Still more, each of the PSM 204a through 204d is one example of the inventive second switch block and has the structure shown in FIG. 13 or 14. Each of the CLBs 206a through 206d and of the CLBs 206a' through 206d' is one example of the inventive second logic block.

The PSMs 204a and 204b are formed in the first and second semiconductor layers. In concrete, the lower-layer PSMs 212a and 212b are formed in the first semiconductor layer and the upper-layer PSMs 214a and 214b are formed in the second semiconductor layer. The PSMs 204c and 204d are formed in the third and fourth semiconductor layers. In concrete, the lower-layer PSMs 212c and 212d are formed in the third semiconductor layer and the upper-layer PSMs 214c and 214d are formed in the fourth semiconductor layer.

The CLBs 206a and 206b are formed in the first semiconductor layer, the CLBs 206a' and 206b' are formed in the second semiconductor layer which is the upper layer of the first semiconductor layer, the CLBs 206c and 206d are formed in the third semiconductor layer which is the upper layer of the second semiconductor layer and the CLBs 206c' and 206d' are formed in a fourth semiconductor layer which is the upper layer of the third semiconductor layer.

The PSM 202 is formed in any one of the first, second, third and fourth semiconductor layers. In this example, the lower-layer PSM 210 is formed in the first semiconductor layer and the upper-layer PSM 208 is formed in the third semiconductor layer. In other examples, the lower-layer PSM 210 is formed in the first semiconductor layer and the upper-layer PSM 208 may be formed in the second semiconductor layer, the lower-layer PSM 210 may be formed in the second semiconductor layer and the upper-layer PSM 208 may be formed in the third semiconductor layer, the lower-layer PSM 210 may be formed in the second semiconductor layer and the upper-layer PSM 208 may be formed in the fourth semiconductor layer or the lower-layer PSM 210 may be formed in the third semiconductor layer and the upper-layer PSM 208 may be formed in the fourth semiconductor layer. Still more, the PSM 202 may be formed in three or fourth layers among the first, second, third and fourth semiconductor layers.

The PSM 202 has the plurality of MOSFETs formed respectively in any one of the first, second, third and fourth semiconductor layers. In this example, the PSM 202 has the MOSFET contained in the lower-layer PSM 210 formed in the fist semiconductor layer and the MOSFET formed in the third semiconductor layer.

The MOSFETs of the PSM 202 switch connections among the signal lines connected to the PSMs 204a through 204d and set the mode of connection of the PSMs 204a through 204d. It is noted that the MOSFET of the PSM 202 is one example of an inventive first or second host transistor.

The PSM 204a has the MOSFET of the lower-layer PSM 212a and the MOSFET of the upper-layer PSM 214a. The MOSFETs of the PSM 204a switch connection between the signal lines connected respectively to the plurality of CLBs 206a and 206a' and set the mode of connection of the plurality of CLBs 206a and 206a'. It is noted that the MOSFET of the lower-layer PSM 212a is one example of the inventive first semiconductor layer transistor and the MOSFET of the upper-layer PSM 214a is one example of the inventive second semiconductor layer transistor.

The PSM 204b has the MOSFET of the lower-layer PSM 212b and the MOSFET of the upper-layer PSM 214b. The MOSFETs of the PSM 204b switch connection between the signal lines connected respectively to the plurality of CLBs 206b and 206b' and set the mode of connection of the plurality of CLBs 206b and 206b'. It is noted that the MOSFET of the lower-layer PSM 212b is one example of the inventive first semiconductor layer transistor and the MOSFET of the upper-layer PSM 214b is one example of the inventive second semiconductor layer transistor.

The PSM 204c has the MOSFET of the lower-layer PSM 212c and the MOSFET of the upper-layer PSM 214c. The MOSFETs of the PSM 204c switch connection between the signal lines connected respectively to the plurality of CLBs 206c and 206c' and set the mode of connection of the plurality of CLBs 206c and 206c'. It is noted that the MOSFET of the lower-layer PSM 212c is one example of the inventive third semiconductor layer transistor and the MOSFET of the upper-layer PSM 214c is one example of the inventive fourth semiconductor layer transistor.

The PSM 204d has the MOSFET of the lower-layer PSM 212d and the MOSFET of the upper-layer PSM 214d. The MOSFETs of the PSM 204d switch connection between the signal lines connected respectively to the plurality of CLBs 206d and 206d' and set the mode of connection of the plurality of CLBs 206d and 206d'. It is noted that the MOSFET of the lower-layer PSM 212d is one example of the inventive third semiconductor layer transistor and the MOSFET of the upper-layer PSM 214d is one example of the inventive fourth semiconductor layer transistor.

The programmable semiconductor integrated circuit 200 having the tree-type wiring structure may be implemented in a small circuit area by constructing the PSM 202 and the PSMs 204a through 204d as well as the CLBs 206a through 206d and the CLBs 206a' through 206d' in the multi-layer structure as described above.

According to the first and second embodiments, the number of MOSFETs implemented per unit area may be increased by constructing the circuits having complicated structures such as the PSM 102 that is necessary for realizing the P-branch tree-type wiring structure in the multi-layer structure. As a result, the circuit area may be reduced and the wiring length may be shortened as compared to the conventional circuit in which the MOSFETs are mounted in a plane. Still more, because the wiring length may be shortened, a wire delay time is lessened and the circuit may be operated at high-speed.

Figure 21:
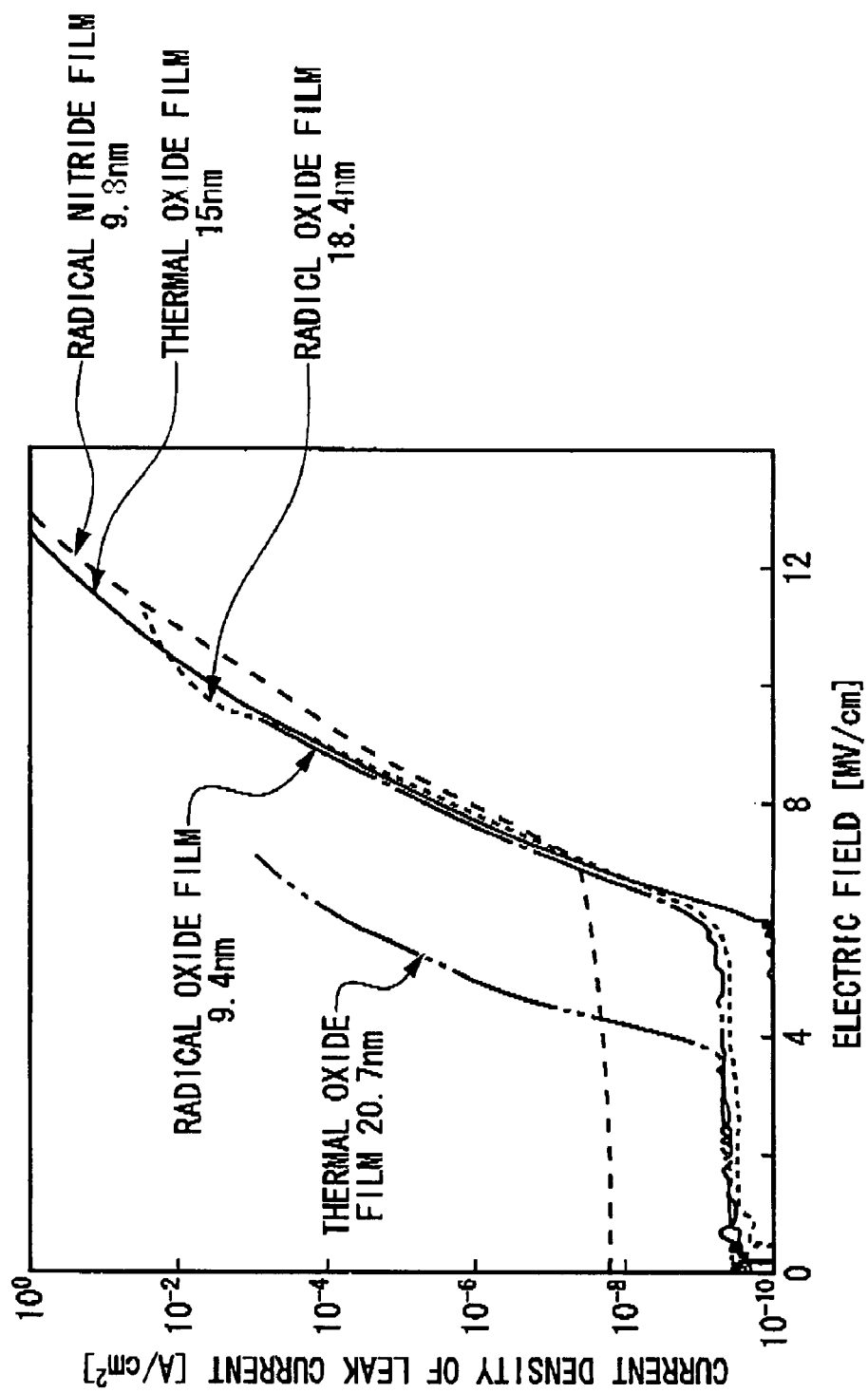
FIG. 21 is a graph showing the relationship between electric field applied to a gate insulating film and a leak current

FIG. 21 is a graph showing the relationship between electric field applied to the gate insulating film and current density of a leakage current. Its axis of abscissa represents the electric field (MV/cm) applied to the gate insulating film and its axis of ordinate represents the current density (A/cm$^2$) of a leakage current. The graph shows the case when the degrees of the leakage current of the gate insulating film formed by means of the thermal oxidation (thermal oxide film: 20.7 nm in thickness), the gate insulating film formed by means of the thermal oxidation (thermal oxide film, 15 nm in thickness), the gate insulating film formed by means of the radical oxidation (radical oxide film: 18.4 nm in thickness), the gate insulating film formed by means of the radical oxidation (radical oxide film: 9.4 nm in thickness) and the gate insulating film formed by means of the radical nitridation (radical nitride film: 9.8 nm in thickness) are compared. It is noted that the graph shows the case when the density of impurities (substrate injection) specifying the density of carriers right under the gate electrode is $10^{-4}$ cm$^{-2}$.

As shown in FIG. 21, the leakage current of the radical oxide film is almost equal to or smaller than the leakage current of the thermal oxide film. Further, the leakage current of the radical nitride film is smaller than the leakage current of the thermal oxide film whose thickness is 20.7 nm when the electric field is greater than about 4 (MV/cm) and is smaller than the leakage current of the thermal oxide film whose thickness is 15 nm when the electric field is greater than about 7 (MV/cm). Accordingly, the higher-performance MOSFET may be formed even when the gate insulating film is formed by means of the radical oxidation or the radical nitridation as compared to the case of forming the gate insulating film by means of the thermal oxidation.

Figure 22:
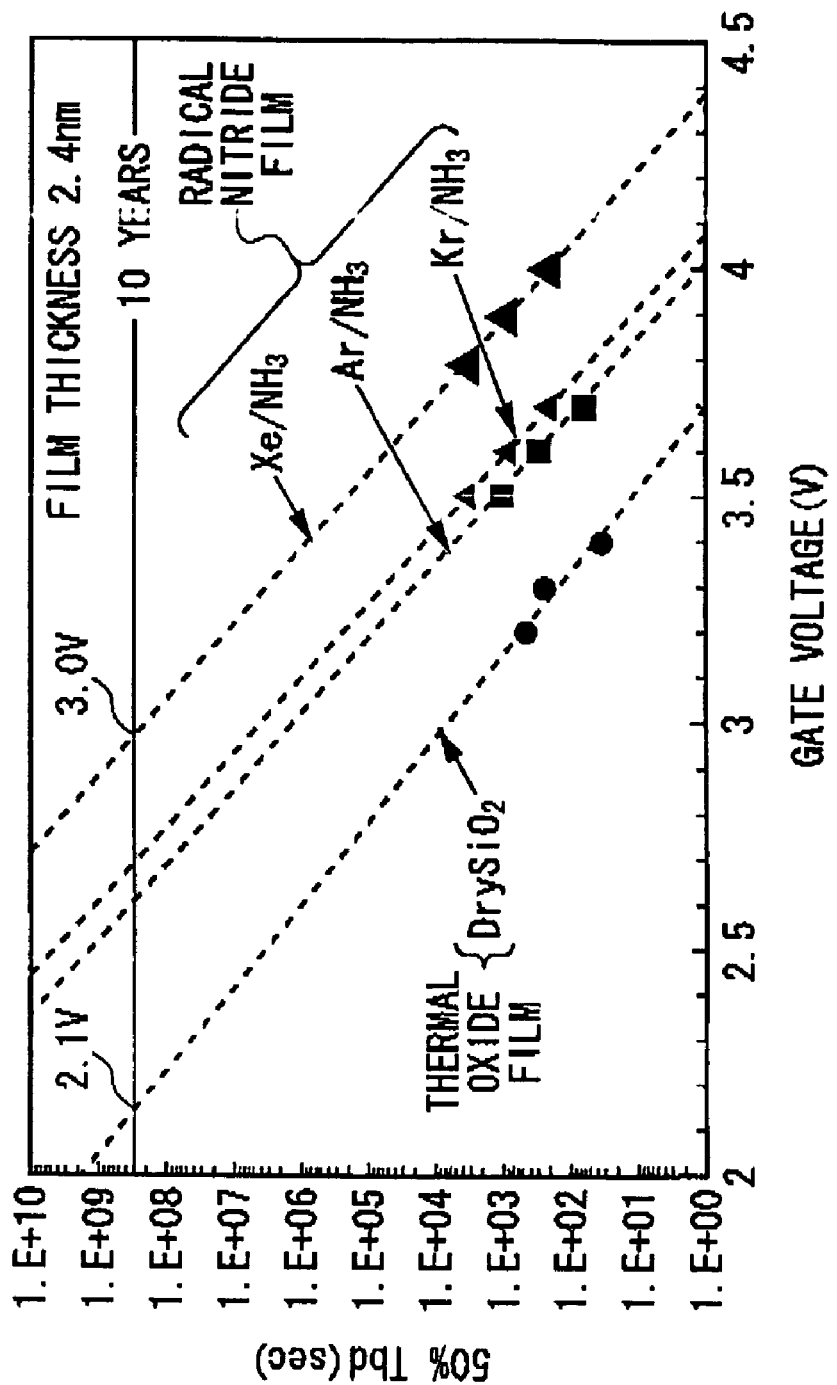
FIG. 22 is a graph showing the relationship between gate voltage and a lifetime of the gate insulating film.

FIG. 22 is a graph showing the relationship between gate voltage and a lifetime of the gate insulating film. Its axis of abscissa represents the gate voltage and its axis of ordinate represents a time (lifetime) until when a half of number of the gate insulating films is broken down under the TDDB (time dependent dielectric breakdown) test. The lifetime of the thermal oxide film (Dry SiO$_2$) formed by means of the thermal oxidation is compared with that of the radical oxide film (Xe/NH$_3$, Ar/NH$_3$, Kr/NH$_3$) formed by means of the radical nitridation. It is noted that the graph shows a case when the thickness of the thermal oxide film and the radical nitride film is 2.4 nm.

As shown in FIG. 22, the lifetime of the radical nitride film becomes 30,000 times of that of the thermal oxide film in some cases. Still more, when the lifetime of the thermal oxide film (Dry SiO$_2$) and that of the radical oxide film (Xa/NH$_3$) formed by means of the radical nitridation by xenon plasma are set at 10 years for example, while 2.1 V may be applied as the gate voltage in case of the thermal oxide film ((Dry SiO$_2$), 3.0 V may be applied as the gate voltage in case of the radical nitride film (Xe/NH$_3$), Accordingly, the MOSFET whose operating speed is high may be formed by forming the gate insulating film by means of the radical nitridation as compared to the case of forming the gate insulating film by means of the thermal oxidation.

Figure 23:
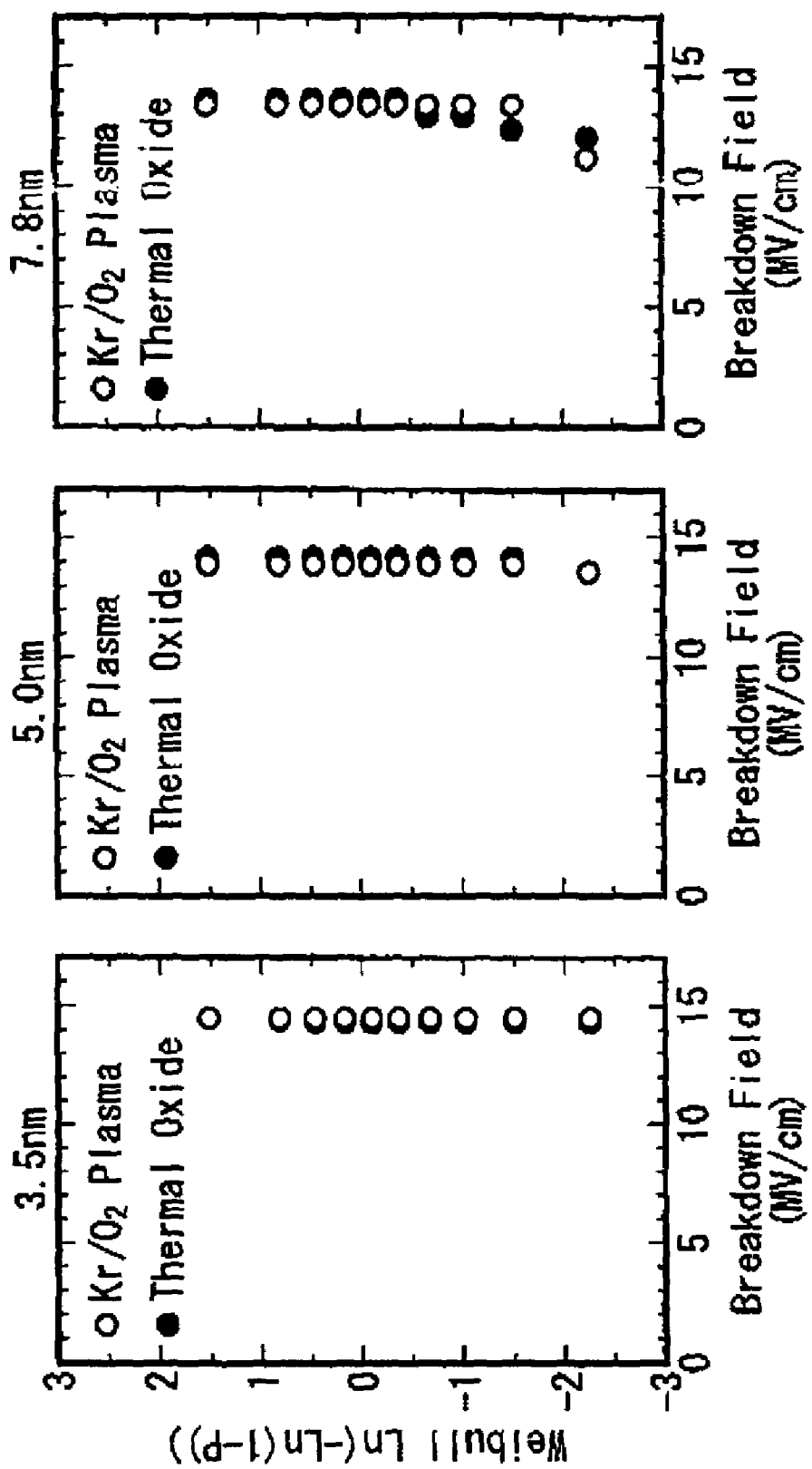
FIG. 23 is a graph showing threshold voltage of the gate insulating film.

FIG. 23 is a graph showing threshold voltage of the gate insulating film. Its axis of ordinate represents Weibull distribution and its axis of abscissa represents the electric field (Breakdown Field) (MV/cm) applied to the gate insulating film. Here, the Weibull distribution is set at 0 when the probability of causing dielectric breakdown when predetermined voltage is applied is 50%. As a result of experiment on the three kinds of thickness of 3.5 nm, 5.0 nm and 7.8 nm, the gate insulating films formed by means of the radical oxidation by using krypton plasma in low electronic temperature present the threshold voltage almost equal to that of the gate insulating film formed by means of the thermal oxidation in all of the three kinds of thickness. Accordingly, it may be understood that the high quality gate insulating film may be formed even in the low electronic temperature (400° C.).

Figure 24:
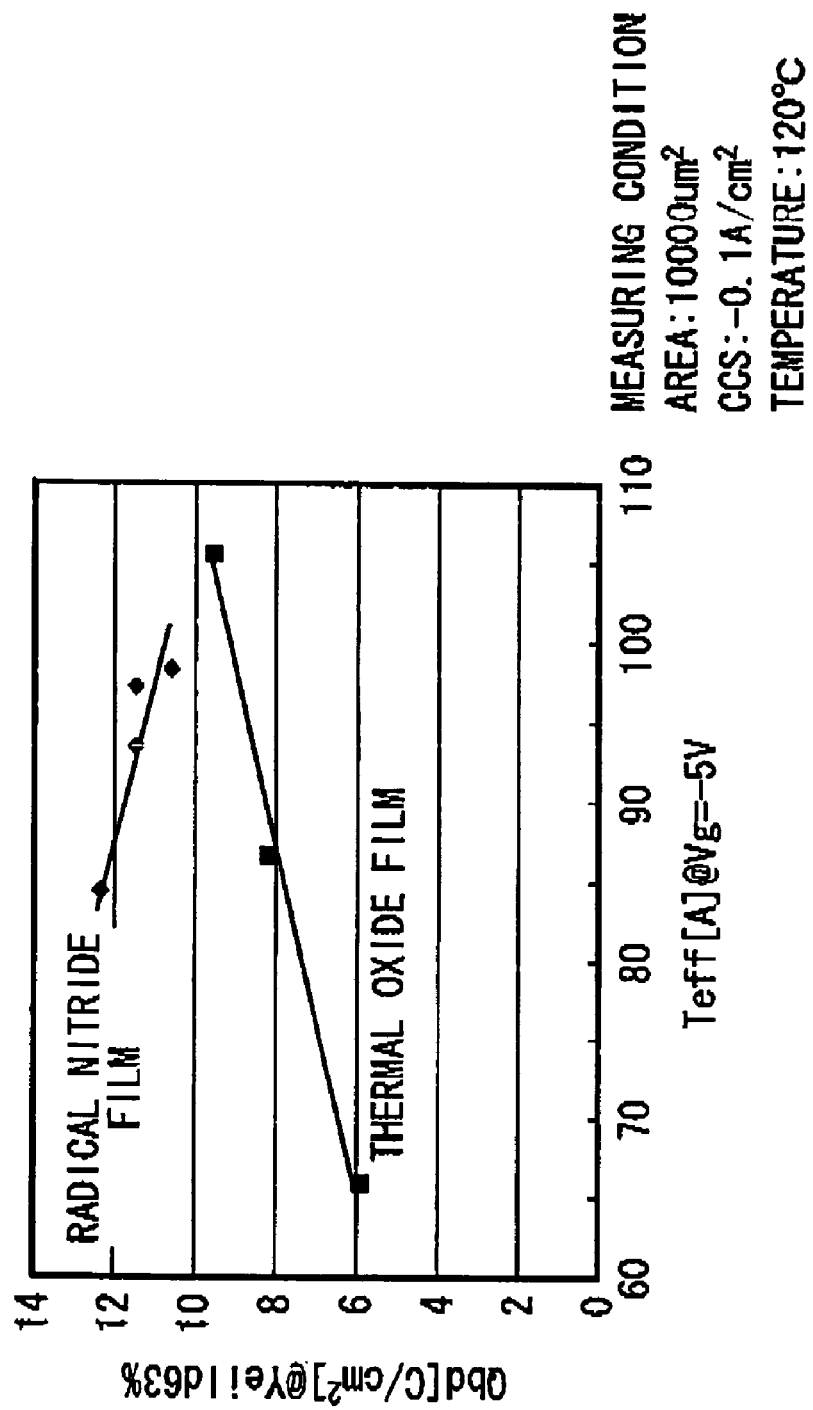
FIG. 24 is a graph showing the relationship between a thickness of the gate insulating film and electric charge causing breakdown of the gate insulating film.

FIG. 24 is a graph showing the relationship between the thickness of the gate insulating film and electric charge Qbd causing the dielectric breakdown. Here, (the electric charge Qdb causing the breakdown)=(fixed current)×(a time till causing the breakdown). This is one of indices of reliability of the gate insulating film. The axis of abscissa represents the thickness of the effective gate insulating film and the axis of ordinate represents the electric charge Qdb when the yield is 63%. The thermal oxide film formed by means of the thermal oxidation is compared with the radical oxide film formed by means of the radical oxidation.

As shown in FIG. 24, when the thickness of the effective gate insulating film is thin (Teff<100 Å), the reliability of the radical oxide film in terms of the Qdb index becomes about 1.5 times of that of the thermal oxide film. This means that the radical oxide film is less liable to be broken down than the thermal oxide film. Accordingly, the MOSFET having the long lifetime may be formed by forming the gate insulating film by means of the radical oxidation as compared to the case of forming the gate insulating film by means of the thermal oxidation.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

What is claimed is:

1. A semiconductor integrated circuit configured in a multi-layer structure, comprising:
    a first switch block for switching connections among a plurality of signal lines by means of a plurality of transistors formed respectively in a plurality of semiconductor layers which includes a first semiconductor layer and a second semiconductor layer, the second semiconductor layer being stacked on the first semiconductor layer; and
    a plurality of first logic blocks formed in each of said plurality of semiconductor layers and connected to each of said plurality of signal lines.

2. The semiconductor integrated circuit as set forth in claim 1, wherein said first switch block is a programmable switch block capable of changing the connection topology among said plurality of signal lines.

3. The semiconductor integrated circuit as set forth in claim 1, wherein said first logic block is a programmable logic block capable of changing functions of a logic circuit.

4. The semiconductor integrated circuit as set forth in claim 1, wherein
    said first switch block has a plurality of first semiconductor layer transistors formed in said first semiconductor layer and a plurality of second semiconductor layer transistors formed in said second semiconductor layer;
    a plurality of first semiconductor layer logic blocks in said plurality of first logic blocks is formed in said first semiconductor layer;
    a plurality of second semiconductor layer logic blocks in said plurality of first logic blocks is formed in said second semiconductor layer;
    said plurality of first semiconductor layer logic blocks is mutually connected by any one of said plurality of first semiconductor layer transistors; and
    said plurality of second semiconductor layer logic blocks is mutually connected by any one of said plurality of second semiconductor layer transistors.

5. The semiconductor integrated circuit as set forth in claim 4, wherein insulation of a gate insulating film of said first semiconductor layer transistor is almost equal to insulation of a gate insulating film of said second semiconductor layer transistor.

6. The semiconductor integrated circuit as set forth in claim 5, wherein said first semiconductor layer logic block is mutually connected with said second semiconductor layer logic block by means of said first semiconductor layer transistor.

7. The semiconductor integrated circuit as set forth in claim 5, wherein said plurality of first semiconductor layer logic blocks and said plurality of second semiconductor layer logic blocks are formed on the identical location in said first semiconductor layer or in said second semiconductor layer.

8. The semiconductor integrated circuit as set forth in claim 1, wherein
    each of said plurality of first logic blocks has a second switch block for switching connections among the plurality of signal lines by means of a plurality of transistors which are formed respectively in a plurality of semiconductor layers; and
    a plurality of second logic blocks formed in each of said plurality of semiconductor layers and connected to each of said plurality of signal lines.

9. The semiconductor integrated circuit as set forth in claim 1, wherein:
    the first semiconductor layer is the lowest layer of among the plurality of semiconductor layers;
    the plurality of transistors formed in the first semiconductor layer includes a gate insulating film formed by means of thermal oxidation; and
    the plurality of transistors formed in the second semiconductor layer includes a gate insulating film formed by means of radical oxidation or radical nitridation.

10. The semiconductor integrated circuit as set forth in claim 1, wherein at least two semiconductor layers of the plurality of semiconductor layers are formed by using a same photo mask.

11. A method for manufacturing the semiconductor integrated circuit as set forth in claim 1, comprising:
    forming a gate insulating film of plurality of transistors formed in the first semiconductor layer by means of thermal oxidation; and
    forming a gate insulating film of the plurality of transistors formed in the second semiconductor layer by means of radical oxidation or radical nitridation,
    wherein the first semiconductor layer is the lowest layer of among the plurality of semiconductor layers.

12. The method for manufacturing a semiconductor integrated circuit as set forth in claim 11, wherein at least two semiconductor layers of the plurality of semiconductor layers are formed by using a same photo mask.

13. A semiconductor integrated circuit configured in a multi-layer structure, comprising:
    a first switch block for switching connections among a plurality of signal lines by means of a plurality of transistors formed respectively in a plurality of semiconductor layers which includes a first semiconductor layer and a second semiconductor layer, the second semiconductor layer being stacked on the first semiconductor layer; and
    a plurality of first logic blocks formed in each of said plurality of semiconductor layers and connected to each of said plurality of signal lines, wherein
    said first switch block has a plurality of first semiconductor layer transistors formed in said first semiconductor layer and a plurality of second semiconductor layer transistors formed in said second semiconductor layer,
    a plurality of first semiconductor layer logic blocks in said plurality of first logic blocks is formed in said first semiconductor layer,
    a plurality of second semiconductor layer logic blocks in said plurality of first logic blocks is formed in said second semiconductor layer,
    said plurality of first semiconductor layer logic blocks is mutually connected by any one of said plurality of first semiconductor layer transistors,
    said plurality of second semiconductor layer logic blocks is mutually connected by any one of said plurality of second semiconductor layer transistors,
    insulation of a gate insulating film of said first semiconductor layer transistor is almost equal to insulation of a gate insulating film of said second semiconductor layer transistor,
    said first semiconductor layer logic block and said second semiconductor layer logic block inputting/outputting digital signals are mutually connected by any one of said plurality of first semiconductor layer transistors, and
    said first semiconductor layer logic block and said second semiconductor layer logic block inputting/outputting analog signals are mutually connected by means of any one of said plurality of second semiconductor layer transistors.

14. A semiconductor integrated circuit configured in a multi-layer structure, comprising:
- a first switch block for switching connections among a plurality of signal lines by means of a plurality of transistors formed respectively in a plurality of semiconductor layers which includes a first semiconductor layer and a second semiconductor layer, the second semiconductor layer being stacked on the first semiconductor layer; and
- a plurality of first logic blocks formed in each of said plurality of semiconductor layers and connected to each of said plurality of signal lines, wherein
- each of said plurality of first logic blocks has a second switch block for switching connections among the plurality of signal lines by means of a plurality of transistors which are formed respectively in a plurality of semiconductor layers, and
- a plurality of second logic blocks formed in each of said plurality of semiconductor layers and connected to each of said plurality of signal lines,
- said second switch block of one of said first logic blocks has a first semiconductor layer transistor formed in a first semiconductor layer among said plurality of semiconductor layers,
- a second semiconductor layer transistor formed in a second semiconductor layer which is the upper layer of said first semiconductor layer among said plurality of semiconductor layers,
- a first semiconductor layer logic block in said plurality of second logic blocks of said one of first logic blocks is formed in said first semiconductor layer,
- a second semiconductor layer logic block in said plurality of second logic blocks of said one of first logic blocks is formed in said second semiconductor layer,
- said first semiconductor layer transistor or said second semiconductor layer transistor switches connection between signal lines connected to said first semiconductor layer logic block and said second semiconductor layer logic block,
- said second switch block of another said first logic block has a third semiconductor layer transistor formed in a third semiconductor layer which is the upper layer of said second semiconductor layer among said plurality of semiconductor layers and a fourth semiconductor layer transistor formed in a fourth semiconductor layer which is the upper layer of said third semiconductor layer among said plurality of semiconductor layers,
- a third semiconductor layer logic block in said plurality of second logic blocks of said other first logic block is formed in said third semiconductor layer,
- a fourth semiconductor layer logic block in said plurality of second logic blocks of said other first logic block is formed in said fourth semiconductor layer,
- said third semiconductor layer transistor or said fourth semiconductor layer transistor switches connection between the signal lines connected to said third semiconductor layer logic block and said fourth semiconductor layer logic block,
- said first switch block has a first host transistor and a second host transistor formed respectively in any one of said first, second, third and fourth semiconductor layers, and
- said first host transistor or said second host transistor switches connection between the signal lines connected to said one of second switch block and to said other second switch block.

* * * * *